United States Patent
Takemura

(10) Patent No.: US 9,257,422 B2
(45) Date of Patent: Feb. 9, 2016

(54) SIGNAL PROCESSING CIRCUIT AND METHOD FOR DRIVING SIGNAL PROCESSING CIRCUIT

(71) Applicant: Semiconductor Energy Laboratory Co., Ltd., Atsugi-shi, Kanagawa-ken (JP)

(72) Inventor: Yasuhiko Takemura, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 513 days.

(21) Appl. No.: 13/689,001

(22) Filed: Nov. 29, 2012

(65) Prior Publication Data

US 2013/0141157 A1 Jun. 6, 2013

(30) Foreign Application Priority Data

Dec. 6, 2011 (JP) ................. 2011-266515

(51) Int. Cl.
*H03K 17/16* (2006.01)
*H01L 27/06* (2006.01)
(Continued)

(52) U.S. Cl.
CPC .............. *H01L 27/06* (2013.01); *G11C 11/403* (2013.01); *G11C 11/405* (2013.01); *G11C 19/184* (2013.01); *G11C 19/28* (2013.01);
(Continued)

(58) Field of Classification Search
CPC ..................................... H03K 17/54
USPC ........................................... 327/379
See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP   1737044 A   12/2006
EP   2226847 A   9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Daniel Puentes
(74) *Attorney, Agent, or Firm* — Robinson Intellectual Property Law Office; Eric J. Robinson

(57) ABSTRACT

A memory element capable of operating at high speed and reducing power consumption and a signal processing circuit including the memory element are provided. As a writing transistor, a transistor which is formed using an oxide semiconductor and has significantly high off-state resistance is used. In a memory element in which a source of the writing transistor is connected to an input terminal of an inverter, a control terminal of a transfer gate, or the like, the threshold voltage of the writing transistor is lower than a low-level potential. The highest potential of a gate of the writing transistor can be a high-level potential. When the potential of data is the high-level potential, there is no potential difference between a channel and the gate; thus, even when the writing transistor is subsequently turned off, a potential on the source side hardly changes.

19 Claims, 15 Drawing Sheets

(51) Int. Cl.
    *H03K 3/01*           (2006.01)
    *H03K 3/356*        (2006.01)
    *G11C 11/403*      (2006.01)
    *G11C 11/405*      (2006.01)
    *G11C 19/18*       (2006.01)
    *G11C 19/28*       (2006.01)
    *H01L 27/108*      (2006.01)

(52) U.S. Cl.
    CPC ............. *H03K 3/01* (2013.01); *H03K 3/35606* (2013.01); *H01L 27/10852* (2013.01)

(56) References Cited

U.S. PATENT DOCUMENTS

| | | | |
|---|---|---|---|
| 5,952,951 | A * | 9/1999 | Fujino ........................ 341/159 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0063287 | A1 | 3/2007 | Sano et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0042218 | A1 | 2/2008 | Igarashi et al. |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0121878 | A1 | 5/2011 | Kato et al. |
| 2011/0134683 | A1 | 6/2011 | Yamazaki et al. |
| 2011/0175646 | A1 | 7/2011 | Takemura et al. |
| 2011/0176357 | A1 | 7/2011 | Koyama et al. |
| 2011/0194332 | A1 | 8/2011 | Saito |
| 2012/0056175 | A1 | 3/2012 | Takemura |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-176153 | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amporphous GIZO (Ga2O3-In2O3-ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFe2O4, and YB2Fe3O7 Types of Structures for Compounds in the In2O3 and Sc2O3-A2O3-BO Systems [A; Fe, Ga, or Al; B: MG, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosphical Magazine, 2001, vol. 81, No. 5, pp. 501-515.

Hosono.H et al., "Working hypothesis to explore novel wide band gap electrically conducting amorphous oxides and examples,", J. Non-Cryst. Solid (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

□ 302 N-type well   ▨ 303 P-type well

▨ 307 First wiring   ⊠ 309 First Contact plug

▨ 310 Second wiring   ⊠ 313 Second Contact plug

314 Third wiring

317 Semiconductor Layer    ⊠ 320 Third Contact plug

321 Fourth wiring

▨ 302 N-type well   ▨ 303 P-type well

▨ 307 First wiring   ⊠ 309 First Contact plug

▨ 310 Second wiring   ⊠ 313 Second Contact plug

SIGNAL PROCESSING CIRCUIT AND METHOD FOR DRIVING SIGNAL PROCESSING CIRCUIT

BACKGROUND OF THE INVENTION

1. Field of the Invention

The present invention relates to a memory element including a semiconductor device and a signal processing circuit including the memory element.

2. Description of the Related Art

It has recently been discovered that a transistor formed using an oxide semiconductor with a large band gap has significantly high off-state resistance, and it has been suggested that the transistor is used to form a memory element or a signal processing circuit (see References 1 to 4). In addition, with a highly thin polycrystalline silicon film, a transistor whose off-state resistance is three or more orders of magnitude higher than that of a conventional transistor has been formed, and its application to a gain cell has been suggested (see Reference 5).

Owing to the high off-state resistance of the transistor in such a memory element, it takes a long time for electric charge accumulated in a capacitor to be lost, and this makes it possible to eliminate the consumption of electric current required for a conventional flip-flop circuit such as an SRAM to maintain memory storage and makes it possible to reduce power consumption. Alternatively, a very large capacitor required for a DRAM is not necessary, which allows the size of a circuit to be reduced, the manufacturing process to be simplified, and the yield to be improved.

REFERENCES

[Reference 1] United States Patent Application Publication No. 2011/0121878

[Reference 2] United States Patent Application Publication No. 2011/0134683

[Reference 3] United States Patent Application Publication No. 2011/0175646

[Reference 4] United States Patent Application Publication No. 2012/0056175

[Reference 5] United States Patent Application Publication No. 2007/0063287

SUMMARY OF THE INVENTION

Such a small off-state current enables a capacitor for holding charge to have a very small capacitance. For example, a transistor formed using an oxide semiconductor can have an on/off ratio of $10^{16}$ or more, in which case the transistor can have an off-state resistance of $10^{22} \Omega$ or more. The capacitance needed for a capacitor to hold charge for one day would be as small as 0.1 fF. When the capacitance of the capacitor is small, the response speed of the transistor can be increased.

In particular, an oxide semiconductor has a field-effect mobility which is less than or equal to $\frac{1}{10}$ of that of silicon; thus, it is preferable that the capacitance of a capacitor be as small as possible in order to increase the response speed. Assuming that the capacitor has a capacitance of 0.1 fF and the transistor has a field-effect mobility of 10 cm$^2$/Vs, the theoretical time constant is approximately 100 ps in the on-state.

However, an oxide semiconductor cannot maintain insulation between a source and a drain by a channel doped with impurities. Therefore, as channel length decreases, off-state resistance decreases. In order to avoid this, the channel length needs to be large to some extent; however, if channel width is substantially as large as the channel length, the circuit area is increased. For this reason, a small channel width as well as a large channel length is needed so as not to increase the circuit area.

Such a long- and narrow-channel transistor has high on-state resistance; for example, when a transistor whose channel length is 10 times the channel width and a capacitor with a capacitance of 0.1 fF are used, the time constant is approximately 1 ns in the on-state. As the channel length further increases for higher off-state resistance, the time constant increases.

Note that the long- and narrow-channel transistor has high off-state resistance; thus, the capacitance of the capacitor can be further reduced. In the above case, since the off-state resistance is tenfold, the capacitance of the capacitor can be $\frac{1}{10}$, i.e., 0.01 ff. The time constant in that case is approximately 100 ps in the on-state.

In some cases, the capacitance of the capacitor can be substantially as small as or smaller than the gate capacitance of the transistor. For example, a transistor with a channel length of 200 nm, a channel width of 20 nm, and a gate insulator thickness (equivalent oxide thickness) of 4 nm has a gate capacitance of 0.04 ff.

In this case, as described below, charges held between a gate and a channel of the transistor in the on-state flow into the capacitor when the transistor is turned off, which causes a significant change in the potential of the capacitor. In such a transistor with a large channel length as described above, this phenomenon becomes particularly noticeable. Note that a parasitic capacitance between the gate and the source also causes a change in the potential of the source; however, it is assumed here that the parasitic capacitance between the gate and the source is sufficiently smaller than the capacitance of the capacitor.

This phenomenon will be described with reference to FIGS. 1A to 1C. FIGS. 1A to 1C illustrate a memory element including a transistor and a capacitor. As illustrated in FIG. 1A, a source of the transistor is connected to one electrode (first electrode) of the capacitor, and the potential of the other electrode (second electrode) of the capacitor is 0 V. In the following description, a high-level potential is +1 V and a low-level potential is 0 V.

The threshold voltage of the transistor is +0.5 V, and the potential of a drain of the transistor is +1 V. In order for the potential of the first electrode of the capacitor to be +1 V, the potential of a gate of the transistor should be higher than the sum of the threshold voltage and the potential of the drain, and is set to +2 V here in consideration of response speed or the like.

As a result, the potential of the first electrode of the capacitor becomes +1 V. Since the potential of the first electrode of the capacitor is higher than the potential of the second electrode of the capacitor, positive charges appear at the first electrode and negative charges appear at the second electrode. A capacitance is also formed between the gate and a channel of the transistor and the potential of the gate is higher than the potential of the channel; therefore, positive charges appear at the gate and negative charges appear at the channel (see FIG. 1A).

Next, when the transistor is turned off, the capacitance formed between the gate and the channel disappears and the charges accumulated move. At this time, some of the negative charges in the channel move to the first electrode of the capacitor (see FIG. 1B). Note that this movement of the charges may take a considerable amount of time. In particular, an oxide semiconductor has higher off-state resistance than a silicon semiconductor; thus, it may take one hour or longer for the movement of the charges.

For example, assuming that the gate capacitance of the transistor is equal to the capacitance of the capacitor, the amount of charge at the gate of the transistor is equal to the amount of charge at the first electrode of the capacitor when the transistor is on (in the state of FIG. 1A). After the transistor is turned off, probabilistically half the negative charges in the channel flow into the first electrode of the capacitor and are offset by half the positive charges there. As a result, the potential of the first electrode of the capacitor is decreased to +0.5 V (see FIG. 1C).

For a semiconductor circuit, data are generally described using two kinds of potentials, a high-level potential and a low-level potential; when the potential changes as described above to a value between the high-level potential and the low-level potential, a memory element might output data different from data that are supposed to be stored.

In the above example, the gate capacitance of the transistor is equal to the capacitance of the capacitor. If the capacitance of the capacitor is smaller, the potential of the source of the transistor is significantly decreased and might become lower than or equal to the low-level potential. In the presence of a parasitic capacitance between the gate and the source of the transistor, the potential of the source is more significantly decreased.

A similar thing happens when the potential of the drain of the transistor is set to 0 V, i.e., the low-level potential, in which case the potential of the first electrode of the capacitor is decreased from 0 V to a minimum of −1 V. However, this potential is lower than the low-level potential and therefore recognized as the low-level potential, so that the output of wrong data does not occur.

Such a problem is not taken into consideration at all for conventional semiconductor circuits. One reason is that conventional transistors have relatively low off-state resistance and thus there has been no memory element which holds data by accumulating charges in a capacitor whose capacitance is substantially equal to or smaller than the gate capacitance of a transistor.

A typical example of memory elements which hold data by accumulating charges is a DRAM, which is completely free from the above problem on data holding because the off-state resistance of a transistor is approximately $10^{14}\Omega$ and therefore the capacitance of a capacitor is 10 fF or more which is sufficiently larger than the gate capacitance of the transistor.

The above problem arises only when a transistor having unprecedentedly high off-state resistance is used and the capacitance of the capacitor is significantly reduced in order to take full advantage of the high off-state resistance. It was only recently that such a transistor having high off-state resistance was discovered. That is why the problem has not been recognized at all.

The problem can be solved by anticipating the aforementioned potential decrease and setting the potential of the drain of the transistor to a higher potential (e.g., setting the high-level potential to +1.5 V), in which case the potential for turning on the transistor needs to be set higher in accordance with the increase in the potential of the drain.

For such driving, the high-level potential which is +1 V in part of the semiconductor circuit needs to be changed into +1.5 V using some kind of circuit before being input to the memory element.

In general, the number of potentials prepared for a semiconductor circuit for data description is preferably small. The use of another potential besides commonly used high-level and low-level potentials for data description leads to a complex circuit configuration.

It is an object of the present invention to provide a memory element, a method for driving the memory element, a signal processing circuit, and a method for driving the signal processing circuit, which solve at least one of the above-described problems. It is another object of the present invention to provide a memory element, a method for driving the memory element, a signal processing circuit, and a method for driving the signal processing circuit, which are capable of reducing power consumption. In particular, it is an object to provide a signal processing circuit and a method for driving the signal processing circuit, which are capable of reducing power consumption by stopping the power supply for a short time.

Note that the description of these problems and objects does not preclude the existence of other problems and objects. Note that one embodiment of the present invention does not necessarily need to solve all the problems or achieve all the objects. Other problems and objects will be apparent from and can be derived from the description of the specification, the drawings, the claims, and the like.

One embodiment of the present invention is a memory element including an n-channel writing transistor whose threshold voltage is lower than a low-level potential or a p-channel writing transistor whose threshold voltage is higher than the low-level potential, and a capacitor. Note that the transistors having these characteristics are called "depletion transistors".

Another embodiment of the present invention is a memory element including an n-channel writing transistor whose threshold voltage is lower than a low-level potential or a p-channel writing transistor whose threshold voltage is higher than the low-level potential, and an inverter. The inverter here may be a CMOS inverter. A source of the writing transistor may be connected to an input terminal of the inverter.

Another embodiment of the present invention is a memory element including an n-channel writing transistor whose threshold voltage is lower than a low-level potential or a p-channel writing transistor whose threshold voltage is higher than the low-level potential, and a transfer gate. The transfer gate here may be a CMOS transfer gate (transmission gate). A source of the writing transistor may be connected to a gate (control input) of the transfer gate.

Note that the writing transistor is preferably a transistor which contains an oxide semiconductor in a channel formation region and whose channel length is 10 or more times, preferably 20 or more times, more preferably 50 or more times the minimum feature size or whose channel length is 1 μm or more.

The writing transistor is preferably stacked over a semiconductor circuit formed using silicon or the like. The above-described channel length can be achieved when an oxide semiconductor layer included in the writing transistor is formed in a region over the semiconductor circuit so as to have a meandering shape or a shape with at least one bend.

For example, a circuit such as a register or an SRAM includes a circuit in which two inverters are combined (e.g., flip-flop circuit). The area occupied by the circuit is 100 $F^2$ (F is the minimum feature size) or more, and generally 200 $F^2$ to 300 $F^2$. Assuming that the area occupied by the circuit in which two inverters are combined is 100 $F^2$ and a writing transistor including an oxide semiconductor is provided in half the area (50 $F^2$) of the circuit, the channel length can be 50 F when the channel width is 1 F.

Furthermore, in the above memory element, the writing transistor can be formed over the inverter, and a variety of circuits besides the inverter may be provided under the wiring transistor. In the case where the memory element includes the inverter and the transfer gate, variation of threshold voltage among transistors included in the inverter and the transfer gate can be reduced by relatively increasing the channel area of the transistors. As a result, the area occupied by the circuits is increased, which is favorable because the writing transistor can have larger channel length and width.

Further, the capacitor does not necessarily need to be intentionally formed, but when formed, the capacitor is preferably stacked over the semiconductor circuit and may be formed in the same layer as the writing transistor or in a different layer from the writing transistor. When the capacitor is formed in the same layer as the writing transistor, although it is necessary to provide a region for the writing transistor and a region for the capacitor, the manufacturing process can be simplified. On the other hand, when the capacitor is formed in a different layer from the writing transistor, although the number of steps for manufacturing the capacitor is increased, the integration degree can be increased.

Note that as the oxide semiconductor, a four-component metal oxide such as an In—Sn—Ga—Zn-based oxide semiconductor, a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor, a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor, an indium oxide, a tin oxide, a zinc oxide, or the like can be used. In this specification, an In—Sn—Ga—Zn—O-based oxide semiconductor means a metal oxide containing indium (In), tin (Sn), gallium (Ga), and zinc (Zn), and there is no particular limitation on the stoichiometric composition thereof. For details of the oxide semiconductor, References 1 to 3 may be referred to.

Another embodiment of the present invention is a method for driving the memory element in which when the above writing transistor is an n-channel transistor, the highest potential applied to the gate is the high-level potential and the lowest potential applied to the gate is lower than the low-level potential. Another embodiment of the present invention is a method for driving the memory element in which when the writing transistor is a p-channel transistor, the lowest potential applied to the gate is the low-level potential and the highest potential applied to the gate is higher than the high-level potential.

Note that the lowest potential applied to the gate in the case where the writing transistor is an n-channel transistor or the highest potential applied to the gate in the case where the writing transistor is a p-channel transistor is referred to as a control potential. In the above embodiment, the absolute value of a difference between the control potential and the high-level potential or the low-level potential may be greater than or equal to 3 V and less than 4 V.

Another embodiment of the present invention is a signal processing circuit which includes the above memory element and which is configured such that the high-level potential, the low-level potential, and the control potential are introduced from the outside. Another embodiment of the present invention is a signal processing circuit in which the above memory element is used in a memory device such as a register, a cache memory, or a main memory. Another embodiment of the present invention is a signal processing circuit (such as a PLD or an FPGA) in which the memory element is used in a circuit for controlling the connection between logic circuits.

An effect of one embodiment of the present invention will be described with reference to FIGS. 2A to 2C. FIGS. 2A to 2C illustrate a memory element including a transistor and a capacitor. As illustrated in FIG. 2A, a source of the transistor is connected to one electrode (first electrode) of the capacitor, and the potential of the other electrode (second electrode) of the capacitor is, but not limited to, 0 V. In the following description, a high-level potential is +1 V and a low-level potential is 0 V. As the writing transistor here, an n-channel transistor whose threshold voltage is −0.5 V is used. In general, a preferable range of threshold voltage is $V_L - V_H < V_{th} < V_L - 0.3$, where $V_H$ is a high-level potential and $V_L$ is a low-level potential (both in volts).

The potential of a drain of the transistor is +1 V. In order for the potential of the first electrode of the capacitor to be +1 V, the potential of a gate of the transistor should be higher than the sum of the threshold voltage and the potential of the drain, and is set to +1 V here in consideration of response speed or the like.

As a result, the potential of the first electrode of the capacitor becomes +1 V. Since the potential of the first electrode of the capacitor is higher than the potential of the second electrode of the capacitor, positive charges appear at the first electrode and negative charges appear at the second electrode. On the other hand, no charges appear between the gate and a channel of the transistor because the potential of the gate is equal to the potential of the channel (see FIG. 2A).

Therefore, even when the transistor is turned off, the movement of charges from the channel to the first electrode of the capacitor does not occur (see FIG. 2B). For this reason, the potential of the first electrode of the capacitor is not significantly changed by turning on or off the transistor (see FIG. 2C).

Note that in the case where the potential of the drain of the transistor is 0 V (the low-level potential), the potential of the first electrode of the capacitor is changed (decreased from 0 V to a minimum of −0.5 V) by turning on or off the transistor, but the potential is lower than the low-level potential, so that the output of wrong data does not occur.

In this manner, data storage can be surely performed even when the capacitance of the capacitor is sufficiently small, e.g., twice the gate capacitance or smaller; thus, the memory element can operate at high speed. That is, one embodiment of the present invention is remarkably effective when the capacitance of the capacitor is twice the gate capacitance or smaller. Note that a gate capacitance can be calculated by using a thickness and a permittivity of a gate insulator and an area of a gate. Similarly, a capacitance of a capacitor can be calculated by using a thickness and a permittivity of its insulator and an area of its electrodes.

Due to the manufacturing process or circuit configuration, the capacitance of the capacitor cannot be sufficiently increased in some cases. For example, particularly when the capacitor is intentionally not provided, although the circuit configuration is simple, only a parasitic capacitance between wirings or the like might correspond to the capacitor. In one embodiment of the present invention, even such a minute capacitance can be used for data holding.

Note that in the case where the capacitance of the capacitor is smaller than ½ of the gate capacitance, the operation speed is mainly determined by the gate capacitance; therefore, even when the capacitance of the capacitor is further decreased, an increase in speed can hardly be expected. Thus, the capacitance of the capacitor is preferably larger than or equal to ½ of the gate capacitance.

With the use of a memory element of one embodiment of the present invention in a memory device such as a register or a cache memory, power consumption can be further reduced. By application of the memory element to a PLD or an FPGA, a flexible signal processing circuit whose circuit configuration can be optionally changed can be obtained. In addition, in the above configuration, the response speed of the memory element is sufficiently high; thus, so-called dynamic reconfiguration can be performed.

A conventional register, cache memory, PLD, or FPGA includes a flip-flop circuit as a memory element and therefore has a large circuit area, whereas a memory element of one embodiment of the present invention can have a smaller circuit area. Furthermore, the amount of power consumed by the memory element of one embodiment of the present invention to maintain storage can be significantly smaller than that consumed by a flip-flop circuit. That is, one embodiment of the present invention is remarkably effective when combined with a transistor or semiconductor device described in any of References 1 to 5.

Note that a gate capacitance of another transistor can be used as the above capacitor, in which case a gate capacitance of an n-channel transistor and a gate capacitance of a p-channel transistor are preferably provided in parallel.

Although the gate capacitance of a transistor changes depending on the potential of the gate, in a structure with a gate capacitance of an n-channel transistor and a gate capacitance of a p-channel transistor provided in parallel, the gate of the n-channel transistor and the gate of the p-channel transistor are always at the same potential that is either a high-level potential or a low-level potential.

Therefore, in either case, one of the n-channel and p-channel transistors is on and has a gate capacitance, and the other is off and has no gate capacitance. As long as the gate capacitances of the n-channel and p-channel transistors are set substantially equal to each other, substantially the same capacitance can be obtained regardless of whether the gates of the n-channel and p-channel transistors are at the high-level potential or at the low-level potential.

In order for the threshold voltage of a transistor to be an intended value as described above, a material used for the gate may be selected in consideration of the electron affinity of an oxide semiconductor used for the channel formation region. Alternatively, a back gate may be provided, to which an appropriate potential may be applied. Alternatively, an appropriate amount of charges may be injected to a floating gate between the channel formation region and the gate, as described in Reference 4.

DETAILED DESCRIPTION OF THE INVENTION

Figure 1A:
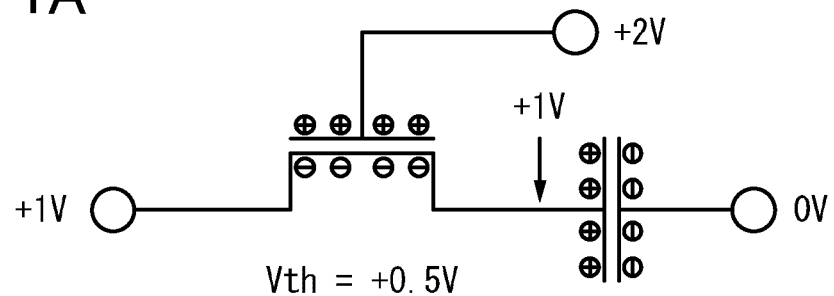
FIGS. 1A to 1C illustrate operation of a memory element.
Figure 1B:
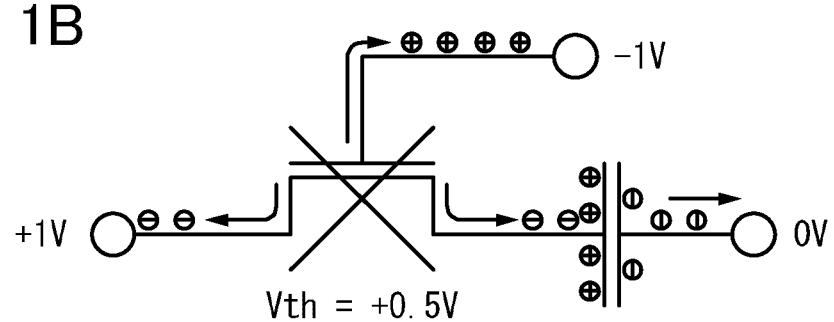
Figure 1C:
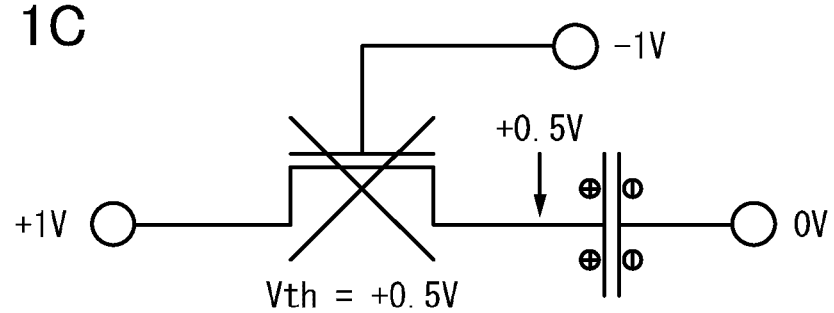

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that what is described (or part thereof) in one embodiment can be applied to, combined with, or replaced with another content in the embodiment and/or what is described (or part thereof) in another or other embodiments.

Note that in each embodiment, what is described in the embodiment is a content described with reference to a variety of diagrams or a content described with text disclosed in this specification.

In addition, by combining a diagram (or part thereof) described in one embodiment with another part of the diagram, a different diagram (or part thereof) described in the same embodiment, and/or a diagram (or part thereof) described in another or other embodiments, much more diagrams can be formed.

Note that "connection" in this specification means the state in which direct current can be supplied. Therefore, a state of connection means not only a state of direct connection but also a state of indirect connection through one or more circuit elements such as a wiring, a resistor, or a switching element, in which effective direct current can be supplied.

For example, in the case where a switching element is provided between two nodes, direct current can be supplied in a certain condition (i.e., only when the switch is on); therefore, the structure can be expressed as "the nodes are connected to each other". On the other hand, in the case where only a capacitor is provided between two nodes, effective direct current cannot be supplied through the capacitor; therefore, the structure can be expressed as "the nodes are not connected to each other".

Similarly, in the case where only a diode is provided between nodes, direct current can be supplied when the potential of one of the nodes is higher; therefore, the structure can be expressed as "the nodes are connected to each other". In this case, even if potentials with which current is not supplied are supplied to the two nodes because of the circuit design (in which case current does not actually flow between the two nodes through the diode), the structure is expressed as "the nodes are connected to each other" in this specification.

For example, in the case where a node A is connected to a source of a transistor and a node B is connected to a drain of the transistor, direct current can flow between the node A and the node B depending on the potential of a gate; thus, the structure is expressed as "the node A and the node B are connected to each other".

On the other hand, in the case where the node A is connected to the source of the transistor and a node C is connected to the gate of the transistor, effective direct current cannot flow between the node A and the node C regardless of the potentials of the source, drain, and gate of the transistor; thus, the structure is expressed as "the node A and the node C are not connected to each other".

In the above description, effective direct current refers to current excluding unintentional current such as leakage current. Note that the value of effective direct current is not defined by its amount (absolute value) and sometimes depends on circuits. That is, in some cases, a small current of 1 pA can be effective current in one circuit, whereas a larger current of 1 µA is not considered as effective current in another circuit.

Needless to say, in one circuit having an input and an output (e.g., an inverter), the input and the output are not necessarily connected to each other. Using the inverter as an example, the input and the output are not connected to each other in the inverter.

Note also that even when a circuit diagram shows independent components as if they are connected to each other, there is a case in which one conductor has functions of a plurality of components such as a case in which part of a wiring also functions as an electrode. The term "connection" in this specification also means such a case where one conductor has functions of a plurality of components.

The names of the "source" (or "source electrode") and the "drain" (or "drain electrode") included in the transistor interchange with each other depending on the polarity of the transistor or the levels of potentials applied to the respective electrodes. In general, in an n-channel transistor, an electrode to which a lower potential is supplied is called a source (or a source electrode), whereas an electrode to which a higher potential is supplied is called a drain (or a drain electrode). In a p-channel transistor, an electrode to which a lower potential is supplied is called a drain (or a drain electrode), whereas an electrode to which a higher potential is supplied is called a source (or a source electrode).

In this specification, assuming for convenience that a source (or a source electrode) and a drain (or a drain electrode) are fixed, when one is called a source (or a source electrode), the other is called a drain (or a drain electrode); however, this is not always the case. Note that in this specification, a source and a source electrode are sometimes regarded as the same thing. Similarly, a drain and a drain electrode are sometimes regarded as the same thing.

Note that in this specification, the state in which first and second transistors are connected to each other in series means the state in which only one of source and drain electrodes of the first transistor is connected to only one of source and drain electrodes of the second transistor. In addition, the state in which first and second transistors are connected to each other in parallel means the state in which one of source and drain electrodes of the first transistor is connected to one of source and drain electrodes of the second transistor and the other of the source and drain electrodes of the first transistor is connected to the other of the source and drain electrodes of the second transistor.

Furthermore, the phrase "the same potential" is not limited to the case where potentials are equal in a strict sense, but also includes the case where potentials have such a difference that does not practically cause a problem. The same applies to the phrase "potential is set to +1 V", which means setting the potential to +1 V or a potential within such a range that does not practically cause a problem. Therefore, the phrase "potential is set to +1 V" includes setting the potential to +1.1 V in one case, but does not in another case.

Note that in examples below, a CMOS inverter is used as an inverter; an inverter including a resistor, a diode, or a depletion transistor as a load may be used.

Embodiment 1

Figure 3A:
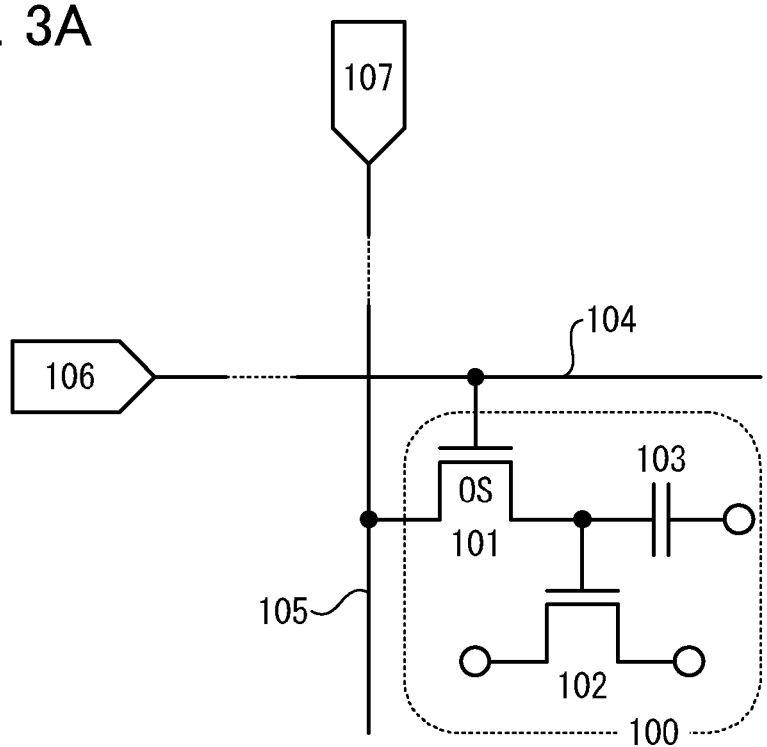
FIGS. 3A and 3B illustrate a memory element and a peripheral circuit thereof, and characteristics of a transistor.

A typical configuration of a memory element in one embodiment of the present invention will be described with reference to FIGS. 3A and 3B. FIG. 3A illustrates a memory element 100 and a peripheral circuit involved. The memory element 100 includes a writing transistor 101, a reading transistor 102, and a capacitor 103. The capacitor 103 here does not necessarily need to be intentionally provided, for which parasitic capacitance between wirings, gate capacitance of the reading transistor 102, or the like can be substituted.

A source of the writing transistor 101 is connected to a gate of the reading transistor 102 and one electrode of the capacitor 103. A source and a drain of the reading transistor 102 and the other electrode of the capacitor 103 are connected to appropriate elements or wirings depending on a circuit in which the memory element is used.

A drain of the writing transistor 101 is connected to a data line 105. The data line 105 is supplied with a potential (a high-level potential or a low-level potential) by a data transfer circuit 107. A gate of the writing transistor 101 is connected to a control line 104. The control line 104 is supplied with a potential by a control circuit 106. A semiconductor material such as single crystal silicon is preferably used for the reading transistor 102 and transistors which are used in the control circuit 106, the data transfer circuit 107, and the like other than the writing transistor 101.

Figure 3B:
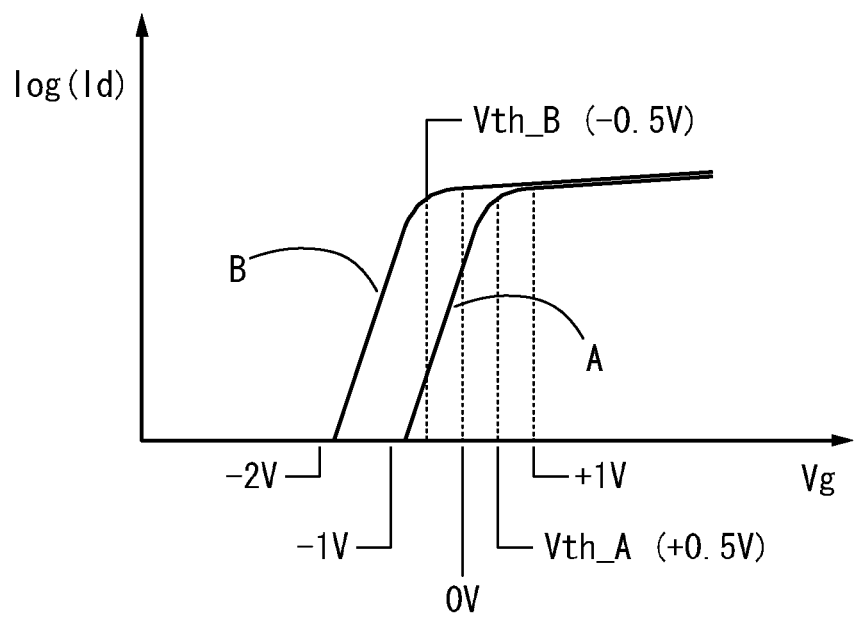

The potential sent out by the control circuit 106 is described here with reference to FIG. 3B. For example, the dependence of source-drain current ($I_d$) on gate-source voltage ($V_g$) of an n-channel transistor with a threshold voltage of +0.5 V is shown in a curved line A in FIG. 3B (note that "potential of the drain">"potential of the source"=0V). When $V_g$ is higher than or equal to $V_{th\_A}$, $I_d$ is large and the transistor is turned on. On the other hand, in a region where $V_g$ is lower than the threshold voltage $V_{th\_A}$, $I_d$ exponentially decreases as $V_g$ decreases, and the transistor is turned off. Such a region is referred to as a subthreshold region.

Similarly, the dependence of source-drain current ($I_d$) on gate-source voltage ($V_g$) of an n-channel transistor with a threshold voltage of −0.5 V is shown in a curved line B in FIG. 3B.

Note that in a manner similar to a transistor formed using silicon, the threshold voltage of a transistor formed using an oxide semiconductor can be changed depending on the work function of a material used for a gate. The threshold voltage of a sufficiently long-channel transistor having an intrinsic semiconductor layer with a thickness of 30 nm or less and a gate insulating film with an equivalent oxide thickness (EOT) of 30 nm or less is roughly determined by the electron affinity of the semiconductor and the work function of the gate. For example, when the electron affinity of the semiconductor is 4.6 eV and the work function of the gate is 5.1 eV, the threshold voltage is about +0.5 V. Furthermore, for example, in the case of a material having a work function of 4.1 eV (e.g., aluminum), the threshold voltage is about −0.5 V.

The length of time the writing transistor 101 is required to hold data is generally from 1 second to 10 years, although it depends on application. In addition, data writing is preferably performed in a period of 100 ps to 10 ns. Under such conditions, the ratio of necessary off-state resistance to necessary on-state resistance ("necessary off-state resistance"/"necessary on-state resistance") is $10^{12}$ to $10^{22}$, preferably $10^{14}$ to $10^{22}$.

In general, considering a change in $I_d$ in the subthreshold region, a tenfold decrease in $I_d$ requires a decrease in $V_g$ by 60 mV at room temperature (25° C.) for an ideal insulated gate transistor. $V_g$ needs to decrease more if there is an influence of a trap level or the like of the gate insulating film or a short-channel effect.

$V_g$ also needs to decrease more if there is a temperature increase. This tendency is proportional to absolute temperature; for example, at 95° C., a tenfold decrease in $I_d$ needs $V_g$ to decrease by 73 mV.

In consideration of the above, for example, to change $I_d$ by 14 orders of magnitude, $V_g$ is required to change by 0.84 V at room temperature or by 1.02 V at 95° C. for an ideal transistor. An actual transistor, for which variation in threshold voltage among transistors and the like should be taken into consideration, requires a larger change than an ideal one. For example, the potential of the gate is required to change by 1 V to 1.5 V at room temperature or by 1.2 V to 1.8 V at 95° C.

The memory element is not necessarily used at room temperature; therefore, in order to sufficiently turn off the transistor, the potential of the gate needs to be held at a potential about 1.5 V lower than the sum of the low-level potential and the threshold voltage, for example. For example, when the low-level potential is 0 V, in the case of using the transistor whose threshold voltage shown in the curved line A is +0.5 V, the potential of the gate is preferably −1 V. On the other hand, in the case of using the transistor whose threshold voltage shown in the curved line B is −0.5 V, the potential of the gate is preferably −2 V.

On the other hand, in order to turn on the writing transistor 101 to write data to the capacitor 103, the potential of the gate of the writing transistor 101 needs to be higher than the sum of the high-level potential and the threshold voltage of the writing transistor 101.

For example, when the high-level potential is +1 V, in the case of using the transistor whose threshold voltage shown in the curved line A is +0.5 V, the potential of the gate is preferably higher than +1.5 V, more preferably, still higher by 0.5 V to sufficiently decrease the on-state resistance of the transistor in practice. For example, the potential is set to +2 V. On the other hand, in the case of using a transistor whose threshold voltage shown in the curved line B is −0.5 V, the potential of the gate is preferably +1 V (i.e., the high-level potential).

When there is a large potential difference between the gate and the channel of the writing transistor 101 here, the potential of the capacitor 103 changes as described above by turning on or off the writing transistor 101. For example, in the case of using the transistor whose threshold voltage is +0.5 V, when the potential of the data line 105 is the high-level potential, the potential difference between the gate and the channel is +1 V; therefore, charges appear at a gate capacitor and the writing transistor 101 is turned off. In addition, some of the charges flow into the capacitor 103 and the gate of the reading transistor 102, causing changes in the potentials of the capacitor 103 and the gate of the reading transistor 102.

On the other hand, in the case of using the transistor whose threshold voltage is −0.5 V as the writing transistor 101, when the potential of the data line 105 is the high-level potential, there is no potential difference or a sufficiently small potential difference between the gate and the channel; therefore, the potentials of the capacitor 103 and the gate of the reading transistor 102 do not change even when the writing transistor 101 is turned off. In the case of using the transistor whose threshold voltage is +0.5 V, a total of four potentials, which are two potentials (the high-level and low-level potentials) for writing data, a potential of +2 V for turning on the writing transistor 101, and a potential of −1 V for turning off the writing transistor 101, are needed for a circuit including the memory element.

On the other hand, in the case of using the transistor whose threshold voltage is −0.5 V, a total of only three potentials, which are the high-level and low-level potentials and a potential (control potential) of −2 V for turning off the writing transistor 101, are needed.

These potentials may be supplied from the outside of the circuit. Potentials supplied from the outside are DC-like and therefore processed into a clock pulse in the circuit including the memory element or in another circuit.

At this time, in the simplest method, a clock pulse having a potential difference that corresponds to the difference between the high-level potential and the control potential (hereinafter referred to as a high-voltage clock pulse) is formed in one integrated circuit (chip) and may be used also in another chip. Part of the high-voltage clock pulse can be used in the control circuit 106 to turn on or off the writing transistor 101. The high-voltage clock pulse may be further processed into a clock pulse whose amplitude is from the high-level potential to the low-level potential (hereinafter referred to as a normal clock pulse), which can be used for the data transfer circuit 107 or the like.

In this method, since the high-voltage clock pulse has a potential difference of 3 V, power consumption is nine times that in the case of the normal clock pulse. For example, when the capacitance of a wiring is 100 fF and the clock frequency is 1 GHz, power consumption is 0.4 mW more than that in the case of the normal clock pulse. Although circuits requiring the high-voltage clock pulse or a pulse having the same amplitude as the high-voltage clock pulse are limited to the control circuit 106 and its peripheral circuit, power consumption is proportional to capacitance, and therefore, power consumption can be reduced by limiting regions where the high-voltage clock pulse is used.

A pulse with a small potential change can be converted into a pulse with a large potential change by using a circuit obtained by altering the balance between an n-channel transistor and a p-channel transistor of an amplifier circuit (inverter) of the control circuit 106 such that the p-channel transistor has a relatively large output. In this method, a conversion circuit may be provided only in a portion where a pulse with a large potential change is needed.

Figure 4A:
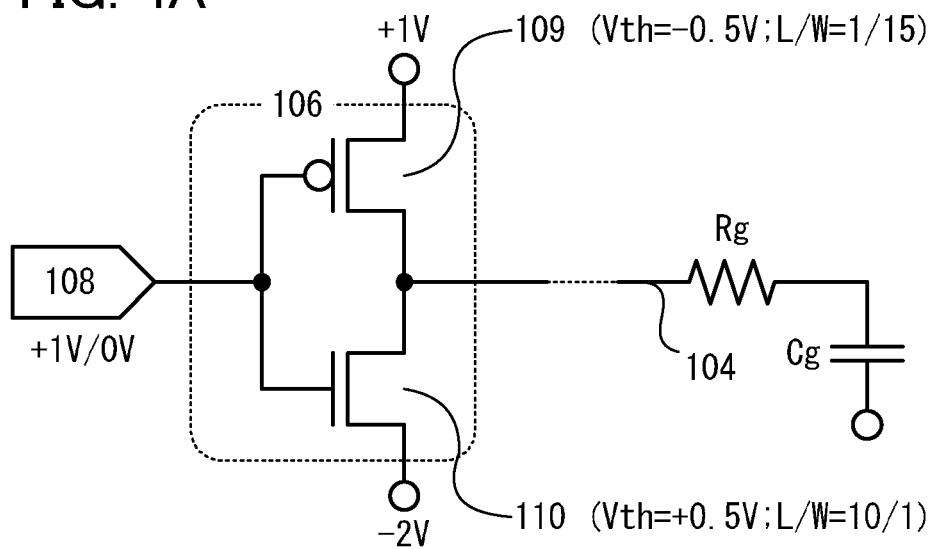
FIGS. 4A and 4B illustrate a circuit used in a peripheral circuit and characteristics thereof.

FIG. 4A illustrates the control line 104, the control circuit 106, and a signal circuit 108 for transmitting a signal to the control circuit 106. The control line 104 has parasitic resistance $R_g$ and parasitic capacitance $C_g$, which affect the waveform of a pulse. The signal circuit 108 outputs a potential of +1 V or 0 V.

The control circuit 106 has at least one p-channel transistor 109 and at least one n-channel transistor 110, which are connected in series. The potential of a source of the p-channel transistor 109 is set to +1 V, and the potential of a source of the n-channel transistor 110 is set to −2 V. These potentials are constant potentials supplied from the outside.

The channel width W_p and the channel length L_p of the p-channel transistor 109 and the channel width W_n and the channel length L_n of the n-channel transistor 110 preferably satisfy the relationship (W_p/W_n)×(L_n/L_p)>100.

The p-channel transistor 109 and the n-channel transistor 110 illustrated in FIG. 4A satisfy L_p/W_p=1/15, L_n/W_n=10, and (W_p/W_n)×(L_n/L_p)=150. In addition, the p-channel transistor 109 and the n-channel transistor 110 have threshold voltages of −0.5 V and +0.5 V, respectively.

In such a circuit, when the potential ($V_{in}$) of gates of the p-channel transistor 109 and the n-channel transistor 110 is 0 V, the potential ($V_{out}$) of a drain of the p-channel transistor 109 (=a drain of the n-channel transistor 110) is +0.95 V, and when $V_{in}$ is +1 V, $V_{out}$ is −2 V.

In this circuit, the n-channel transistor 110 is in the on-state, regardless of the value of $V_{in}$. Because of its high on-state resistance, its operation is mainly determined by whether the p-channel transistor 109 is turned on or off.

Figure 4B:
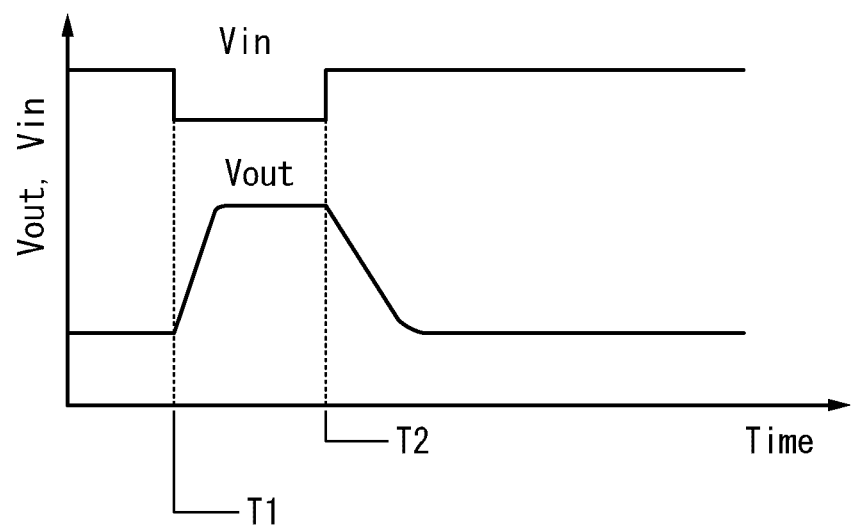

For example, when a rectangular pulse is input as $V_{in}$, $V_{out}$ has such a waveform as illustrated in FIG. 4B. At a time T1 when $V_{in}$ is changed from a high level to a low level, the p-channel transistor 109 is turned on and $V_{out}$ starts to increase from −2 V. At this time, the p-channel transistor 109 has an on-state resistance of about 5 kΩ. As described above, $V_{out}$ increases to +0.95 V.

At a time T2 when $V_{in}$ is changed from the low level to the high level, the p-channel transistor 109 is turned off. On the other hand, the n-channel transistor 110 has a lower on-state resistance because of the increase in the potential of its gate. Due to these effects, $V_{out}$ starts to decrease. At this time, the n-channel transistor 110 has an on-state resistance of about 10 kΩ. Therefore, the rate of potential change is about half the rate of potential change immediately after the time T1.

Note that when $V_{in}$ is 0 V, a shoot-through current of 0.1 mA flows from the source of the p-channel transistor 109 to the source of the n-channel transistor 110. On the other hand, when $V_{in}$ is +1 V, hardly any shoot-through current flows. Accordingly, in using this circuit, as the proportion of time when $V_{in}$ is 0 V increases, power consumption increases.

For example, when a pulse generated by the signal circuit 108 has a duty ratio of 50%, one circuit alone consumes a power of 0.15 mW. For example, a CPU includes a thousand such circuits or more and therefore may consume a power of about 0.1 W.

This figure is so large that it is beyond comparison to that of a circuit using the above-described high-voltage clock pulse. However, unlike in the case of a clock pulse, the control circuit does not constantly generate a pulse, and the average duty ratio of a pulse generated by the signal circuit 108 may be lower than 0.1%. In that case, power consumption is about 0.1 mW, which is smaller than that in the case of the high-voltage clock pulse. Furthermore, such a control circuit may be provided in a place where it is needed, and power consumption due to parasitic capacitance is sufficiently small.

This method is preferably employed particularly for a circuit which is controlled by a normal pulse from the outside and supplied with the same constant potential as the control potential from the outside but to which the high-voltage clock pulse is not input. In general, a high-voltage clock pulse or a signal with the same amplitude which is generated in one chip and introduced into another integrated circuit causes an increase in power consumption because of an increase in parasitic capacitance.

Embodiment 2

Figure 5A:
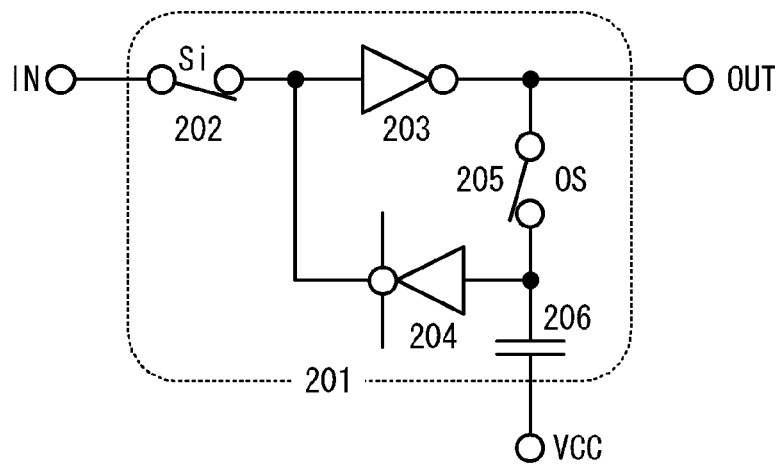
FIGS. 5A to 5C illustrate an example of a memory element and an example of operation thereof.

In this embodiment, an example of a memory element will be described. FIG. 5A is a circuit diagram illustrating an example of a memory element of this embodiment. A memory element 201 of this embodiment includes a first switching element 202, an inverter 203, and a clocked inverter 204. A similar function can be obtained using a switching element and an inverter instead of the clocked inverter 204. The first switching element 202 can be formed using a silicon transistor.

Note that for the purpose of lowering a voltage necessary for operation to reduce power consumption, a transmission gate in which an n-channel transistor and a p-channel transistor are connected in parallel may be used as the first switching element.

An input signal IN which is input to the memory element is controlled by the first switching element 202. An output of the inverter 203 is connected to an input of the clocked inverter 204, and an output of the clocked inverter 204 is connected to an input of the inverter 203. In accordance with a synchronization signal of the clocked inverter 204, the inverter 203 and the clocked inverter 204 can form or break up a flip-flop circuit. These components are used in a known memory element.

The memory element 201 of this embodiment further includes a second switching element 205 formed using a transistor with sufficiently high off-state resistance or the like and a capacitor 206 with appropriate capacitance. The second switching element 205 is provided between the output of the inverter 203 and the input of the clocked inverter 204; one electrode of the capacitor 206 is connected to the input of the clocked inverter 204; and the other electrode of the capacitor 206 is supplied with an appropriate potential VCC. Note that the potential VCC is not limited to a fixed potential. In addition, the capacitor 206 does not necessarily need to be intentionally provided.

Note that the second switching element 205 may be provided between the output of the clocked inverter 204 and the input of the inverter 203, and one electrode of the capacitor 206 may be connected to the input of the inverter 203. However, in that case, because of its structure, a pulse to be input to the inverter 203 is deformed, and the length of time a shoot-through current flows in the inverter 203 increases.

Figure 5B:
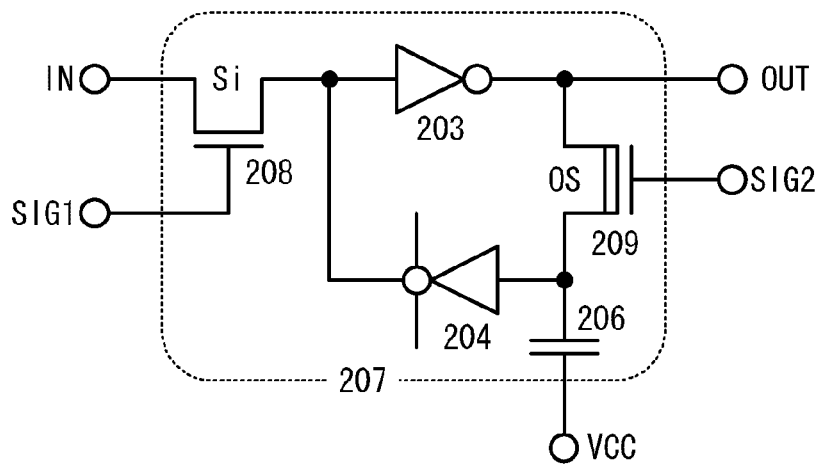

FIG. 5B illustrates an example of a more specific circuit configuration of the memory element of this embodiment. A memory element 207 illustrated in FIG. 5B includes a silicon transistor 208 which is an n-channel transistor as the first switching element and a transistor 209 which is an n-channel transistor formed using an oxide semiconductor as the second switching element. The silicon transistor 208 and the transistor 209 are controlled by a signal SIG1 and a signal SIG2, respectively.

An example of a method for operating the memory element 207 will be briefly described. Note that the circuit illustrated in FIG. 5A or 5B can be operated by a method other than the following method.

In a period in which a signal is relatively frequently input to or output from the memory element 207 (i.e., a period in which the switching of the silicon transistor 208 is frequent), the transistor 209 is kept on.

On the other hand, in a period in which no signal is input to or output from the memory element 207 (i.e., a period in which the switching of the silicon transistor 208 is not performed for a long time, or a period in which data processing is not needed), the transistor 209 is turned off. In that case, although the output of the inverter 203 and the input of the clocked inverter 204 are disconnected from each other, the off-state resistance of the transistor 209 is so high that the previous output potential of the inverter 203 is held at the input of the clocked inverter 204 for a sufficient period of time.

This state does not change even when the supply of power to the inverter 203 and the clocked inverter 204 is stopped. By stopping the supply of power to the inverter 203 and the clocked inverter 204, the power consumption due to leakage current in the inverter 203 and the clocked inverter 204 in that period can be reduced.

When the supply of power to the inverter 203 and the clocked inverter 204 is stopped, data stored in the flip-flop circuit formed by the inverter 203 and the clocked inverter 204 is lost. However, data are held at the input of the clocked inverter 204. In order to restore data in the flip-flop circuit, the clocked inverter 204 is activated after the supply of power to the inverter 203 and the clocked inverter 204 is started again. As a result, an inverted potential of the potential held at the input of the clocked inverter 204 is input to the inverter 203, and the inverter 203 outputs a further inverted potential, i.e., the potential held at the input of the clocked inverter 204. Then, when the transistor 209 is turned on, the flip-flop circuit is formed.

Figure 5C:
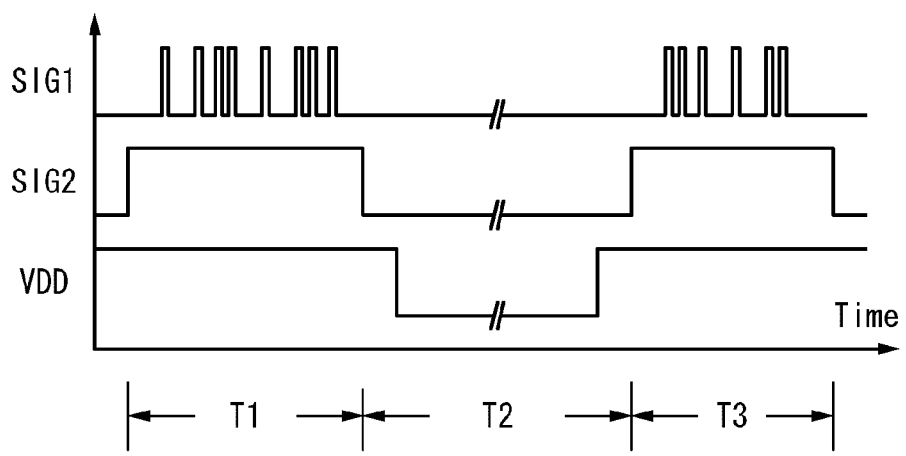

FIG. 5C is a diagram illustrating the above operation. In a period T1, the silicon transistor 208 is frequently and repeatedly turned on and off. At this time, power (VDD) of the inverter 203 and the clocked inverter 204 is at a high level. In addition, the signal SIG2 is set such that the transistor 209 is turned on.

A period T2 is a period in which data processing is not performed. After the signal SIG2 is set such that the transistor 209 is turned off, VDD is set to a low level.

A period T3 is a period in which data processing is performed. After VDD is set to the high level, the signal SIG2 is set such that the transistor 209 is turned on.

In the above operation, it is preferable that the period T2 be sufficiently longer than the period T1 or the period T3. In the memory element 207 of this embodiment, power consumption can be reduced by stopping the supply of power to the inverter 203 and the clocked inverter 204. The amount of power consumption reduced in that case is referred to as W1.

On the other hand, when power is supplied to the inverter 203 and the clocked inverter 204 and the potential to be output from the inverter 203 is changed, power is consumed by storing charge at or releasing charge from the gate of the transistor 209 and the capacitor 206 (which are not provided in a conventional memory element). An increase of power consumption due to this factor is referred to as W2.

Note that power is also consumed when the signal SIG2 is applied. An increase of power consumption due to this factor is referred to as W3. The range of change in potential of the gate of the transistor 209 formed using an oxide semiconductor is wider than that of an ordinary silicon transistor because of the necessity of a higher on/off ratio as described in Embodiment 1. The transistor 209 generally has a long channel and therefore has a larger gate capacitance than an ordinary silicon transistor. Thus, when the number of changes in the signal SIG2 is large (e.g., substantially the same as that in the signal SIG1), power consumption is considerably increased.

However, as can be understood from the above description, the frequency of change in the signal SIG2 is much lower than that in the signal SIG1. Therefore, W3 can be considered sufficiently smaller than W2. In other words, the amount of power consumption which is obtained by subtracting W2 from W1 can be considered to be reduced in the memory element 207.

W1 increases as the period T2 increases, and W2 increases as the number of times the silicon transistor 208 is turned on and off increases. Therefore, the memory element 207 of this embodiment is effective when used in an information processing device with a small amount of data processing (low frequency of SIG1) and mostly on standby (the period T2).

Note that when the capacitor 206 has a small capacitance, W2 is small, which is preferable in order to increase the operation speed of the memory element 207. However, as described above, in the case where the transistor 209 has a positive threshold voltage, the potential of the capacitor 206 is changed when the capacitance of the capacitor 206 is decreased to substantially the same level as or smaller than the gate capacitance of the transistor 209.

Thus, the capacitance of the capacitor 206 needs to be 5 or more times, preferably 10 or more times, the gate capacitance of the transistor 209; however, it is needless to say that such an increase in the capacitance of the capacitor 206 leads to an increase of power consumption and a decrease of operation speed.

In contrast, when the threshold voltage of the transistor 209 is less than zero, there is no problem with the potential even when the capacitance of the capacitor 206 is sufficiently small. In this case, even when the capacitor 206 is not intentionally provided, the gate capacitance of a transistor included in the clocked inverter 204 and another parasitic capacitance, for example, would be sufficient. Needless to say, a smaller capacitance of the capacitor 206 (or corresponding parasitic capacitance or the like) is preferable in terms of both speed and power consumption.

Figure 6A:
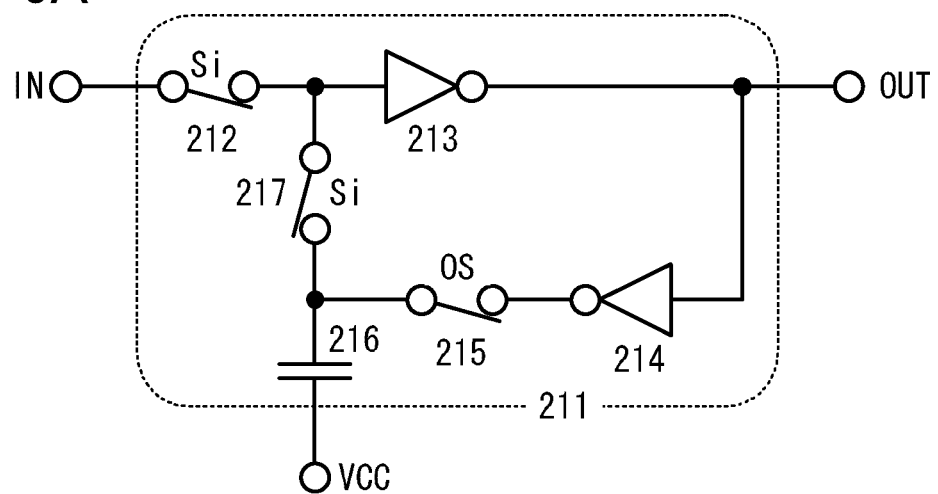
FIGS. 6A and 6B each illustrate an example of a memory element.

FIG. 6A illustrates an example of another memory element of this embodiment. A memory element 211 illustrated in FIG. 6A includes an inverter 214 and a third switching element 217 connected in series, instead of the clocked inverter. The third switching element 217 as well as the first switching element 212 is formed using a silicon transistor.

In addition, a second switching element 215 with high off-state resistance is provided between the inverter 214 and the third switching element 217. One electrode of a capacitor 216 is connected to a node between the second switching element 215 and the third switching element 217.

In the memory element 211, as in the memory element 201, the second switching element 215 is kept on in a period in which data processing is performed, and kept off in the other periods. If the third switching element 217 is on in the period in which data processing is performed, the waveform of an input pulse of the inverter 213 may be distorted and the length of time a shoot-through current flows in the inverter 213 may be increased by the influence of the gate capacitance of the second switching element 215 and the capacitance of the capacitor 216.

In order to avoid this phenomenon, the first switching element 212 and the third switching element 217 are turned on at different timings. In other words, the third switching element 217 is turned on after time τ passes from the time when the first switching element 212 is turned on. The time τ can be determined by the gate capacitance of the second switching element 215, the capacitance of the capacitor 216, and the on-state resistance of the second switching element 215.

Needless to say, a smaller capacitance of the capacitor 216 (or corresponding parasitic capacitance or the like) is preferable in terms of both speed and power consumption. Therefore, it is preferable to decrease the capacitance of the capacitor 216. To achieve this, the threshold voltage is set such that the second switching element 215 is turned on at a high-level potential.

Figure 6B:
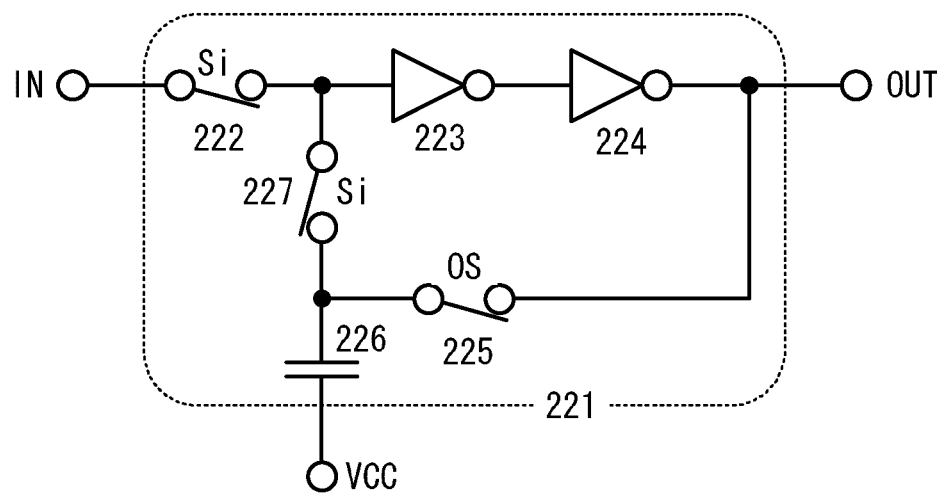

FIG. 6B illustrates an example of another memory element of this embodiment. A memory element 221 illustrated in FIG. 6B includes an inverter 224 and a third switching element 227 connected in series, instead of the clocked inverter. The third switching element 227 as well as a first switching element 222 is formed using a silicon transistor. A potential of the same phase as that of a potential input to the memory element 221 is output.

A second switching element 225 with high off-state resistance is provided between the inverter 224 and the third switching element 227. One electrode of a capacitor 226 is connected to a node between the second switching element 225 and the third switching element 227. An output of the inverter 224 is an output of the memory element 221.

In the memory element 221, as in the memory element 201 and the memory element 211, the second switching element 225 is kept on in a period in which data processing is performed, and kept off in the other periods. In order to prevent the waveform of a pulse to be input to the inverter 223 from being distorted, the first switching element 222 and the third switching element 227 are turned on at different timings as in the memory element 211.

It is preferable to decrease the capacitance of the capacitor 226 (or corresponding parasitic capacitance or the like). To achieve this, the threshold voltage is set such that the second switching element 225 is turned on at a high-level potential.

The memory elements shown in FIGS. 5A to 5C and FIGS. 6A and 6B can be operated without the special conditions for the second switching elements 205, 215 and 225. However, more preferable advantages can be obtained by using the transistors having the threshold voltage satisfying the above described conditions.

Embodiment 3

Figure 7A:
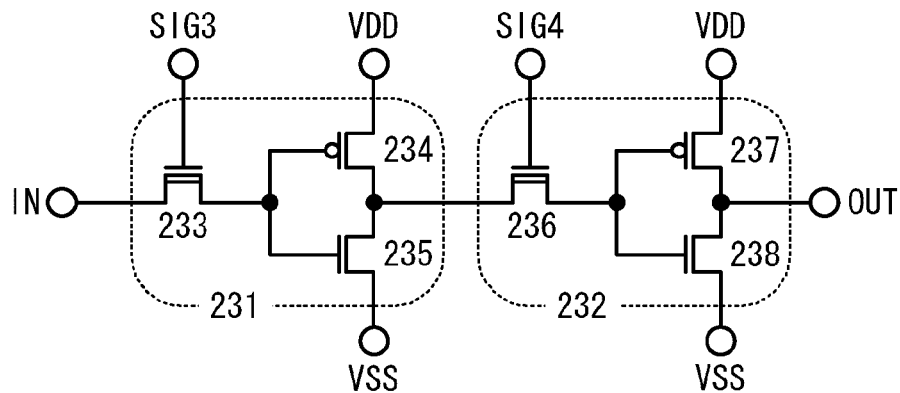
FIGS. 7A to 7C each illustrate a signal processing circuit including a memory element.

In this embodiment, an example of a signal processing circuit will be described. FIG. 7A illustrates a circuit diagram of an example of a signal processing circuit of this embodiment. The signal processing circuit illustrated in FIG. 7A, in which a memory element 231 and a memory element 232 are connected in series, outputs data in the order of inputting. The memory element 231 here includes a writing transistor 233 and a CMOS inverter including a p-channel transistor 234 and an n-channel transistor 235, and a source of the writing transistor 233 is connected to an input terminal of the inverter. A gate of the writing transistor 233 is controlled by a signal SIG3. An input signal IN is input to a drain of the writing transistor 233.

The memory element 232 here includes a writing transistor 236 and a CMOS inverter including a p-channel transistor 237 and an n-channel transistor 238, and a source of the writing transistor 236 is connected to an input terminal of the inverter. An output signal OUT of the signal processing circuit is output from an output terminal of the inverter. A drain of the writing transistor 236 is connected to an output terminal of the inverter of the memory element 231. A gate of the writing transistor 236 is controlled by a signal SIG4.

An example of operation of such a signal processing circuit will be described. In the following example, the inverters are constantly active. First, the signal SIG3 and the signal SIG4 are set to a control potential (e.g., −2 V). In this state, the writing transistor 233 and the writing transistor 236 are off.

Next, the signal SIG3 is set to a high-level potential (e.g., +1 V), and the input signal IN is set to the high-level potential or a low-level potential (e.g., 0 V) depending on first data. As a result, the writing transistor 233 is turned on, and the potential of the input terminal of the inverter of the memory element 231 becomes a potential based on the first data.

After that, the signal SIG3 is set to the control potential. The writing transistor 233 is turned off. Because of the sufficiently high off-state resistance of the writing transistor 233, the potential of its source can be held for a necessary period.

On the other hand, an inverted potential of the potential of the input signal IN is output from the output terminal of the inverter of the memory element 231.

Then, the signal SIG4 is set to the high-level potential. As a result, the writing transistor 236 is turned on, and an output of the inverter of the memory element 231 is input to the inverter of the memory element 232. An output of the inverter of the memory element 232 is output as the output signal OUT.

After that, the signal SIG4 is set to the control potential. The writing transistor 236 is turned off. Because of the sufficiently high off-state resistance of the writing transistor 236, the potential of its source can be held for a necessary period. In this state, the memory element 231 and the memory element 232 store the same data (the first data).

Next, the signal SIG3 is set to the high-level potential, and the input signal IN is set to the high-level potential or the low-level potential depending on second data. As a result, the writing transistor 233 is turned on, and the potential of the input terminal of the inverter of the memory element 231 becomes a potential based on the second data.

After that, the signal SIG3 is set to the control potential. The writing transistor 233 is turned off. Because of the sufficiently high off-state resistance of the writing transistor 233, the potential of its source can be held for a necessary period. In this state, the second data is stored in the memory element 231, and the first data is stored in the memory element 232. After that, the signal SIG4 is set to the high-level potential; thus, the second data is written to the memory element 232 and output as the output signal OUT.

Although the inverters are constantly active in the above example, the inverters may be active only when data is input to the memory element 231, when data is transferred between the memory element 231 and the memory element 232, and when data is output from the memory element 232, and may be inactive for the rest, in order to reduce power consumption. In that case, powers of the inverters of the memory elements may be separately controlled; for example, the inverter of the memory element 231 is active, while the inverter of the memory element 232 is inactive.

Figure 7B:
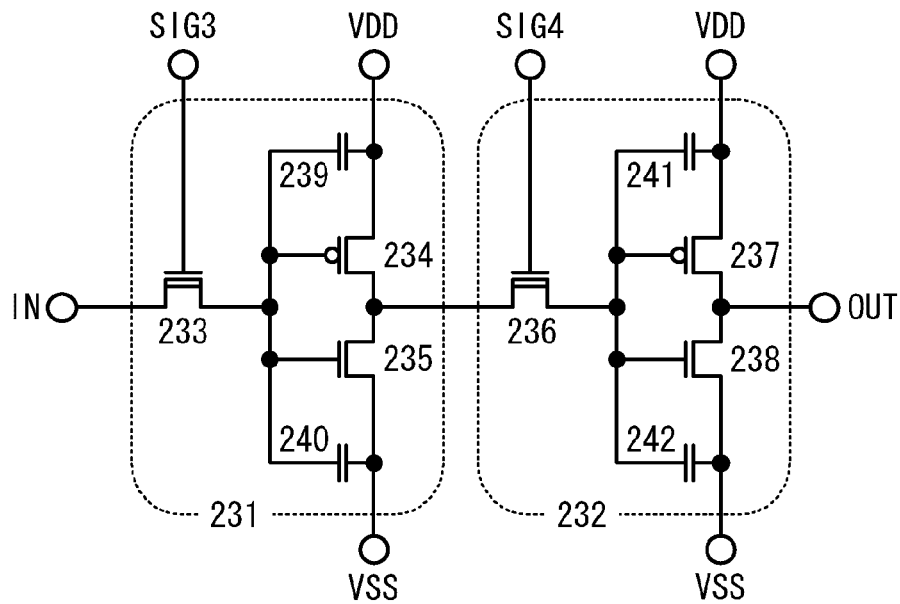

Note that as illustrated in FIG. 7B, for example, at least one of capacitors 239 to 242 between the source of the writing transistor 233 and a source of the p-channel transistor 234, between the source of the writing transistor 233 and a source of the n-channel transistor 235, between the source of the writing transistor 236 and a source of the p-channel transistor 237, and between the source of the writing transistor 236 and a source of the n-channel transistor 238 may be intentionally formed.

Figure 7C:
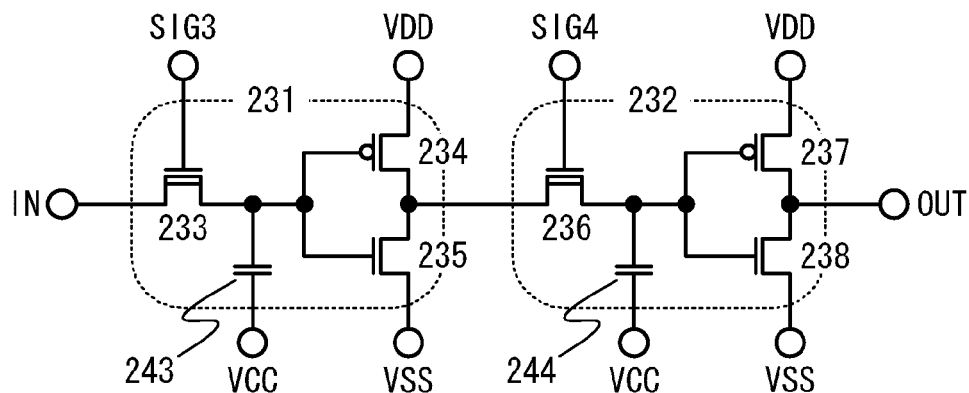

Alternatively, as illustrated in FIG. 7C, for example, at least a capacitor 243 between the source of the writing transistor 233 and an appropriate potential VCC or a capacitor 244 between the source of the writing transistor 236 and the appropriate potential VCC may be intentionally formed.

When having an excessive capacitance, these capacitors cause a decrease of operation speed and an increase of power consumption of the memory elements. Therefore, it is preferable that a capacitance connected to a source of one writing transistor (including capacitances of these capacitors and parasitic capacitance) be twice the gate capacitance or smaller.

Note that a conventional signal processing circuit requires two inverters and two switching elements for each memory element. A signal processing circuit of one embodiment of the present invention, such as the signal processing circuits illustrated in FIGS. 7A to 7C, can be formed with one inverter and one writing transistor, and the writing transistor can be stacked over the inverter, which enable the degree of integration to be improved.

When a conventional degree of integration is acceptable, the channel area of transistors used in the inverter can be increased, whereby threshold voltage variation can be further reduced and reliability can be further improved.

Note that the writing transistor 233 and the writing transistor 236 should have a larger channel area to have sufficient characteristics. Thus, in applications where the writing transistor 233 and the writing transistor 236 are frequently turned on and off, power consumption may be increased. On the other hand, in applications which do not require much high-frequency response (such as a shift register used in a driver of an active-matrix display device), power consumption can be reduced.

Figure 8A:
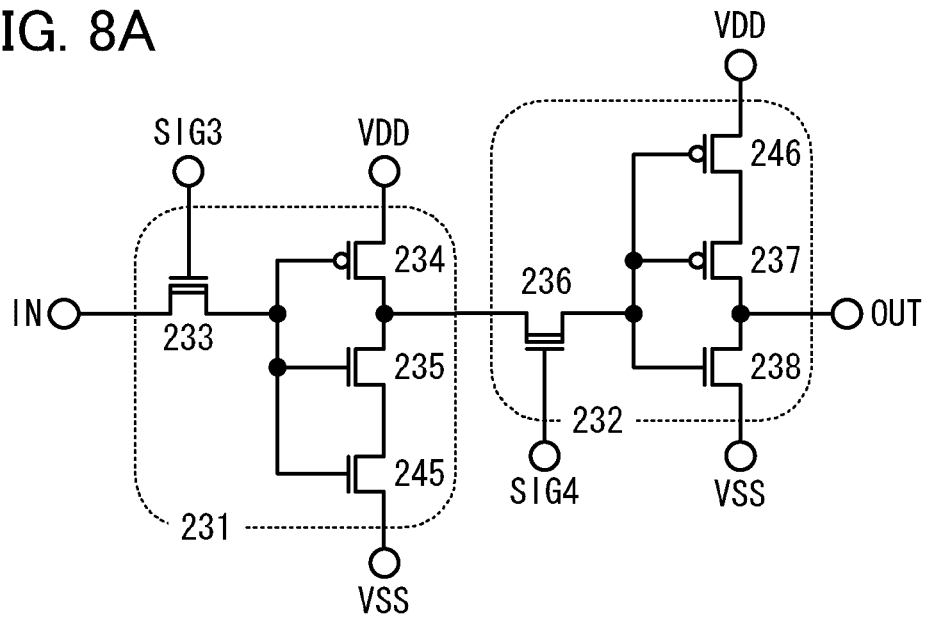
FIGS. 8A and 8B each illustrate a signal processing circuit including a memory element.

FIG. 8A illustrates an example of another signal processing circuit of this embodiment. Some signal processing circuits may show an extreme bias in data to be held. A typical example is a shift register described below or the like, in which input data is mostly either "1" or "0" (which depends on the order of memory elements or the like) and the opposite data is input occasionally. Another example is a circuit-setting memory (configuration memory) such as a programmable logic device (PLD).

In the case where data stored in memory elements are biased to certain data as described above, leakage current of inverters can be reduced. For example, in the case where the input signal IN which is input to the signal processing circuit illustrated in FIG. 7A is mostly at the low-level potential (i.e., the output signal OUT is also at the low-level potential), the output of the memory element 231 is mostly at the high-level potential. In other words, the p-channel transistor 234 of the inverter of the memory element 231 is on, and the n-channel transistor 235 thereof is off.

In that case, the leakage current of the inverter is determined by the off-state resistance of the n-channel transistor 235. Thus, when an n-channel transistor 245 is connected in series to the n-channel transistor 235 as illustrated in FIG. 8A, the off-state resistance is twofold when considered simply, and thus, leakage current can be reduced.

In particular, when a short-channel transistor or a transistor whose threshold voltage has a small absolute value is connected in series, the off-state resistance is fivefold or more, or tenfold or more in some cases; therefore, the effect of reducing leakage current is significant. This is because the electric field between the source and the drain is weakened by half and an effective negative voltage is applied between the gate and the source of the n-channel transistor 235.

The memory element 232 is also similar, and in most cases, the p-channel transistor 237 of the inverter is off, and the n-channel transistor 238 thereof is on. Since the leakage current of the inverter is determined by the off-state resistance of the p-channel transistor 237, the leakage current can be reduced by connecting the p-channel transistor 246 in series to the p-channel transistor 237 as illustrated in FIG. 8A.

A similar effect can be obtained when the n-channel transistor 235 and the p-channel transistor 237 in FIG. 7A have longer channel lengths, for example.

Figure 8B:
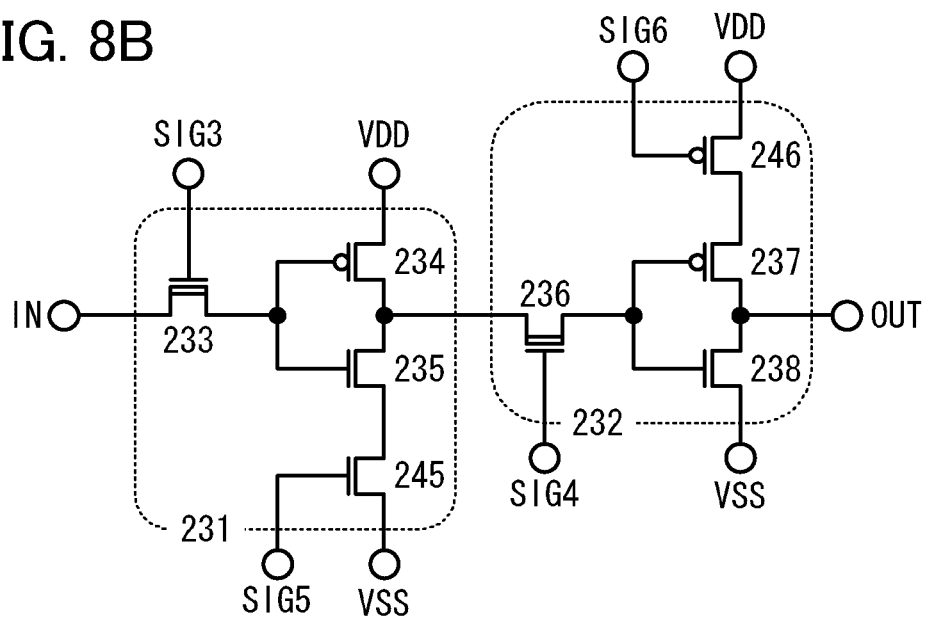

In the signal processing circuit illustrated in FIG. 8A, the n-channel transistor 245 and the p-channel transistor 246 operate in synchronization with the n-channel transistor 235 and the p-channel transistor 237, respectively, but may be controlled by a signal SIG5 and a signal SIG6 from the outside of the memory elements as illustrated in FIG. 8B.

In addition, in FIGS. 8A and 8B, one n-channel transistor or p-channel transistor is provided in each memory element, but one n-channel transistor or p-channel transistor may be provided for a plurality of memory elements. In that case, by setting the channel width of the additionally provided transistor as appropriate, leakage current can be further reduced, or the speed of response to input of the opposite data can be increased.

The signal processing circuits shown in FIGS. 7A to 7C and FIGS. 8A and 8B can be operated without the special conditions for the writing transistors 233 and 236. However, more preferable advantages can be obtained by using the transistors having the threshold voltage satisfying the above described conditions.

Embodiment 4

In this embodiment, an example of a signal processing circuit of one embodiment of the present invention will be described with reference to FIG. 9, FIGS. 10A to 10C, and FIGS. 11A to 11C. Note that in this embodiment, the same hatch pattern indicates the same kind of component.

Figure 9:
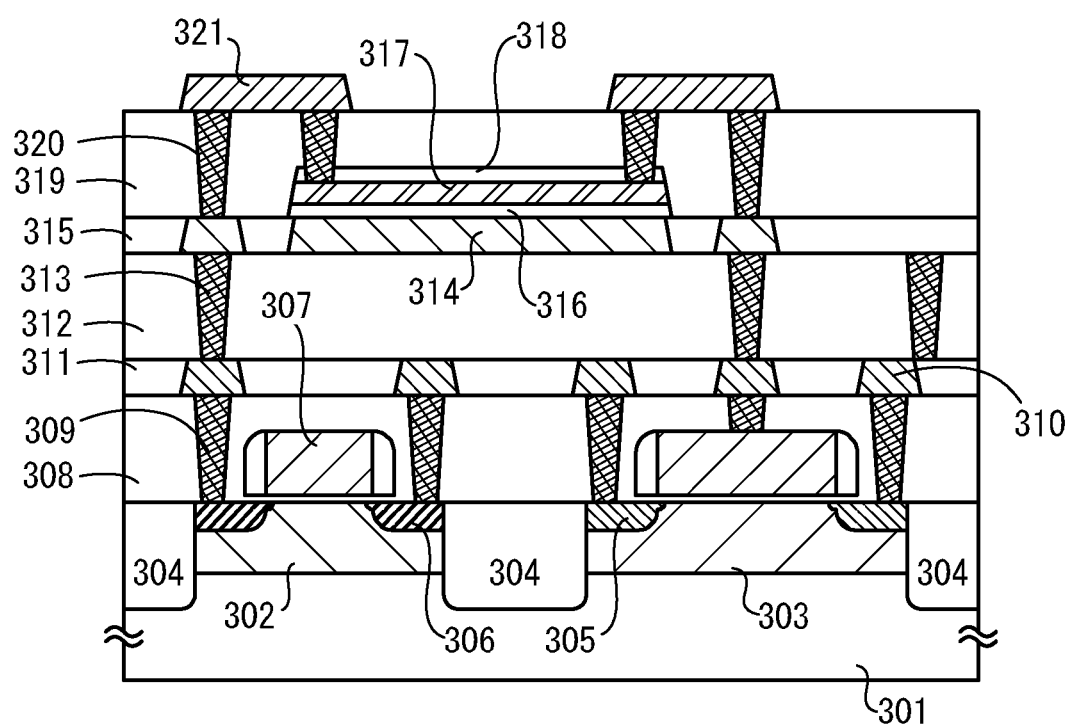
FIG. 9 is a cross-sectional view illustrating a structure of a memory element.
Figure 10A:
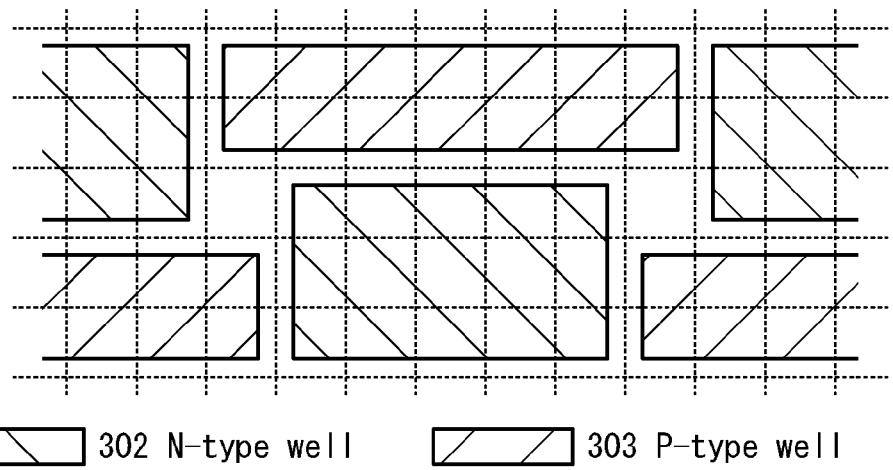
FIGS. 10A to 10C are top views illustrating a structure of a memory element.
Figure 10B:
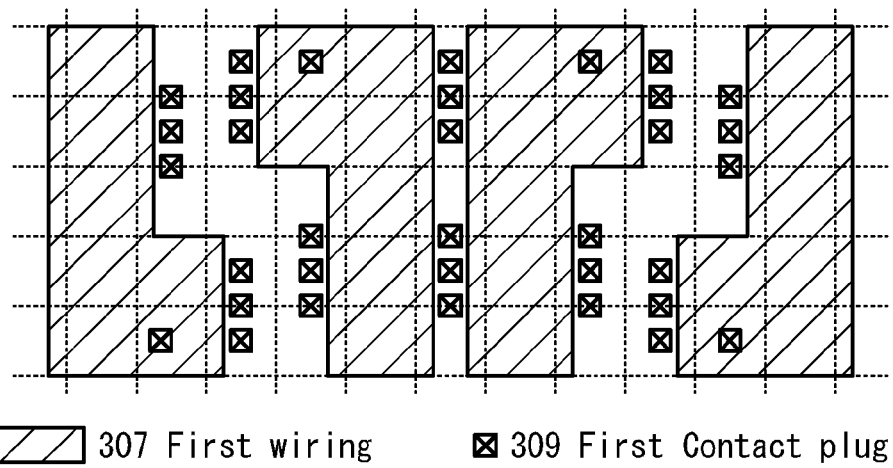
Figure 10C:
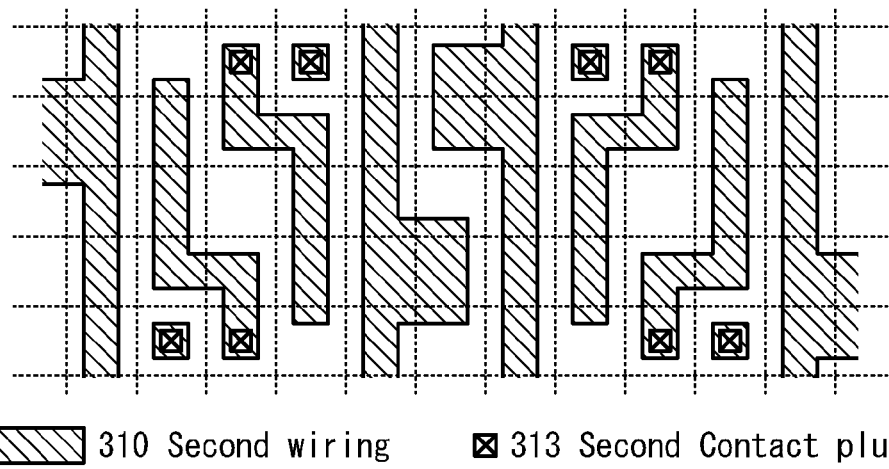

First, a stacked structure of a semiconductor memory device of one embodiment of the present invention will be schematically described with reference to FIG. 9. Note that known semiconductor integrated circuit fabrication techniques, References 1 to 3, and the like can be referred to for the details. Note that FIG. 9 is not a view illustrating a particular cross section.

The semiconductor memory device is formed using a substrate 301 having a single crystal semiconductor surface. In the substrate 301, an n-type well 302, a p-type well 303, and an element isolation insulator 304 are formed. In addition, an n-type region 305, a p-type region 306, and a first wiring 307 are formed. The first wiring 307 serves as a gate of a transistor. Note that the threshold voltage variation of transistors used in an amplifier circuit such as an inverter needs to be small; thus, the width of wirings serving as gates of these transistors is preferably larger than the minimum feature size so that the transistors have a large channel area.

When an inverter is formed using an n-channel transistor and a p-channel transistor, their channel length and channel width are preferably determined in consideration of the mobility so that the transistors have substantially symmetrical on-state characteristics. In addition, the n-channel transistor and the p-channel transistor preferably have substantially the same channel area in consideration of the threshold voltage variation, the gate capacitance, and the like. In other words, the channel area of the n-channel transistor is preferably designed to be in the range of 80% to 125% of that of the p-channel transistor.

Given that, for example, the transistors have a rectangular channel and that the channel length and channel width of the n-channel transistor are 5 F and 3 F, respectively, and the channel length and channel width of the p-channel transistor are 3 F and 5 F, respectively, the transistors have substantially the same channel area and substantially the same on-state current. Since the channel area of these transistors is 15 times that of a normal transistor, the threshold voltage variation is reduced. The threshold voltage variation is inversely proportional to the square root of the channel area and is reduced to about ¼ here.

Similarly, it is possible that the channel length and channel width of the n-channel transistor are 7 F and 4 F, respectively, and the channel length and channel width of the p-channel transistor are 4 F and 7 F, respectively. Alternatively, it is possible that the channel length and channel width of the n-channel transistor are 12 F and 7 F, respectively, and the channel length and channel width of the p-channel transistor are 7 F and 12 F, respectively. That is, it is preferable that the channel length and channel width of the n-channel transistor be set to α and β, respectively, and that the channel length and channel width of the p-channel transistor be set to β and α, respectively (where, $2.4 \leq \alpha^2/\beta^2 \leq 3.75$).

If it is difficult to form a rectangular channel such as the ones described above because of layout limitation, the transistors may be designed so that their channels have a polygonal shape or the like to substantially obtain needed on-state current and channel area. It is needless to say that one of the n-channel and p-channel transistors or both may have a channel area of 1 $F^2$.

It appears that an increase in channel area of transistors included in an inverter interferes with an increase in degree of integration. However, as is clear from the signal processing circuit illustrated in FIG. 7A, a smaller number of transistors are used; therefore, the degree of integration is not inferior to that of a conventional equivalent circuit.

For example, an equivalent circuit including a conventional flip-flop circuit has six transistors, and therefore one memory element requires an area of 100 $F^2$ to 150 $F^2$. In contrast, in a memory cell described in this embodiment, although the n-channel transistor and the p-channel transistor each have a channel area of 15 $F^2$, the area of one memory cell is 70 $F^2$.

On the other hand, threshold voltage variation can be reduced by the increase of the channel area and is, in this embodiment, about ¼ of that in the case where the n-channel transistor and the p-channel transistor each have a channel area of 1 $F^2$ (which corresponds to the case of a conventional flip-flop circuit). In other words, malfunction does not occur even when the difference between the high-level potential and the low-level potential is decreased. Therefore, power consumption can be effectively reduced.

Note that when a transistor having such a large channel area is used, operation speed is slightly decreased because the gate capacitance of the transistor is correspondingly large. In the memory element of this embodiment, a writing transistor has a channel area of 27 $F^2$ as described below; therefore, the operation speed is about ⅔ of that in the case where a transistor having a channel area of 1 $F^2$ is used in the inverter.

On the other hand, since the gate capacitance of the transistor included in the inverter is sufficiently larger than parasitic capacitance between a gate and a source of the writing transistor, there is also the effect of stabilizing the potential of the source of the writing transistor. Furthermore, in return for the decrease in operation speed, the length of time data can be held increases. The length of time data can be held by the memory element of this embodiment is 15 times that in the case where a transistor having a channel area of 1 $F^2$ is used in an inverter.

A first interlayer insulator 308 is formed to cover the first wiring 307 and then a first contact plug 309 is formed. Further, a second wiring 310 and a first embedment insulator 311 are formed over the first interlayer insulator 308. Part of the second wiring 310 serves to supply power to an inverter.

A second interlayer insulator 312, a second contact plug 313, a third wiring 314, and a second embedment insulator 315 are formed thereover. Part of the third wiring 314 serves as a gate of a writing transistor. In one embodiment of the present invention, the threshold voltage of the writing transistor needs to be lower than the low-level potential; therefore, a material used for the third wiring 314 needs to be suitable for satisfying that requirement.

For example, since an oxide semiconductor containing indium and/or zinc has an electron affinity in the range from 4.3 eV to 4.8 eV, a material having a work function of 4.3 eV or less, such as aluminum, titanium, n-type silicon, or n-type germanium, is preferable.

A stack of a gate insulator 316, a semiconductor layer 317, and a protective insulating layer 318 is formed over the third wiring 314. These are preferably processed so as to have substantially the same shape. Furthermore, a third interlayer insulator 319 and a third contact plug 320 are formed. Part of the third contact plug 320 is connected to the semiconductor layer 317. A fourth wiring 321 is formed thereover.

Note that since part of the third contact plug 320 is in contact with the semiconductor layer 317, it is preferable to pay attention to the electron affinity of the semiconductor layer 317 and the work function of a material used for the third contact plug 320. For example, a material which provides an ohmic contact between the third contact plug 320 and the semiconductor layer 317 is preferable. In the case where the semiconductor layer 317 is formed using an intrinsic semiconductor having an electron affinity of 4.6 eV, a material having a work function of 4.5 eV or less, such as titanium or titanium nitride, is preferably used for a portion of the third contact plug 320 which is in contact with the semiconductor layer 317.

Figure 11A:
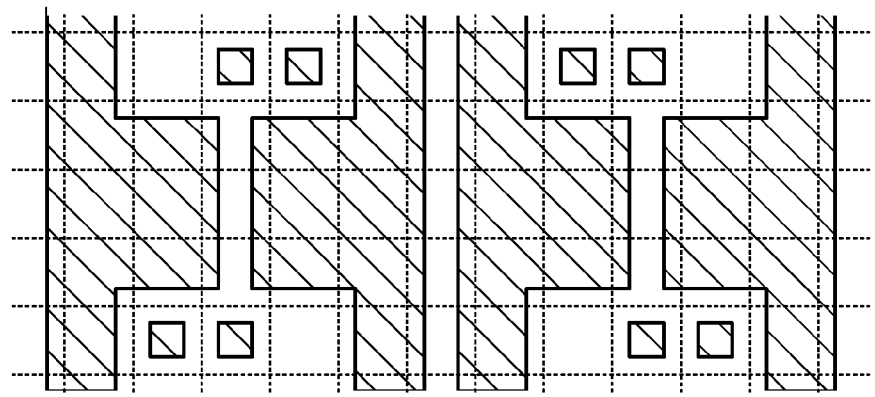
FIGS. 11A to 11C are top views illustrating a structure of a memory element.
Figure 11B:
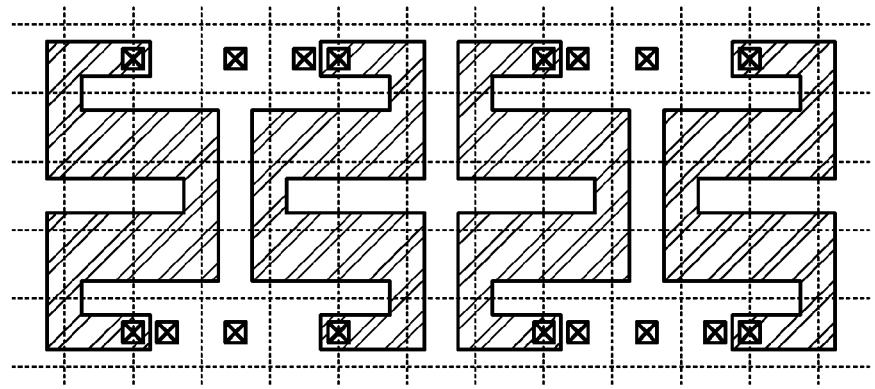

Note that the semiconductor layer 317 preferably has a meandering shape as illustrated in FIG. 11B so that the effective channel length becomes long. In that case, a wide portion and a narrow portion may be provided. When the wide portion is enlarged, the on-state resistance is decreased and therefore the operation speed of the writing transistor can be increased even in consideration of the contribution of an increase in gate capacitance due to the increase in channel area.

In this embodiment, the channel area, i.e., the area of overlap between the semiconductor layer 317 and part of the third wiring 314 serving as the gate of the writing transistor, is 27 $F^2$. Assuming that the gate insulator 316 and a gate insulator of the transistor included in the inverter have equal EOTs, the gate capacitance of the inverter corresponding to a capacitor of the memory element is about 56% of the gate capacitance of the writing transistor.

Figure 11C:
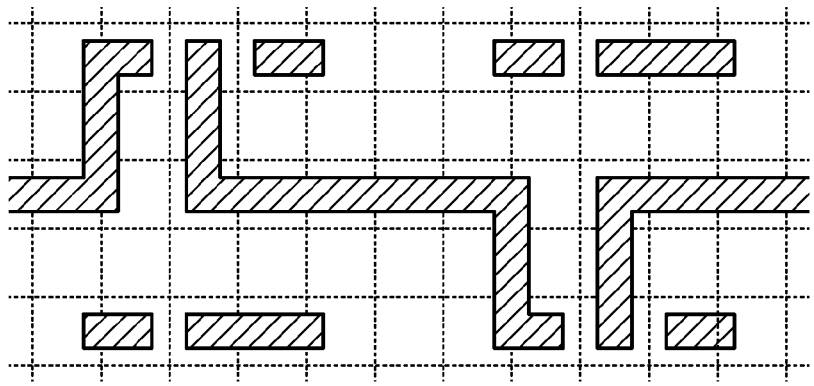

FIGS. 10A to 10C and FIGS. 11A to 11C illustrate the positions, shapes, and the like of the n-type well 302 and the p-type well 303 (which are in FIG. 10A), the first wiring 307 and the first contact plug 309 (which are in FIG. 10B), the second wiring 310 and the second contact plug 313 (which are in FIG. 10C), the third wiring 314 (which is in FIG. 11A), the semiconductor layer 317 and the third contact plug 320 (which are in FIG. 11B), and the fourth wiring 321 (which is in FIG. 11C).

The semiconductor memory device shown in FIG. 9, FIGS. 10A to 10C, and FIGS. 11A and 11B can be operated without the special conditions for the writing transistors. However, more preferable advantages can be obtained by using the transistors having the threshold voltage satisfying the above described conditions.

Embodiment 5

Figure 12A:
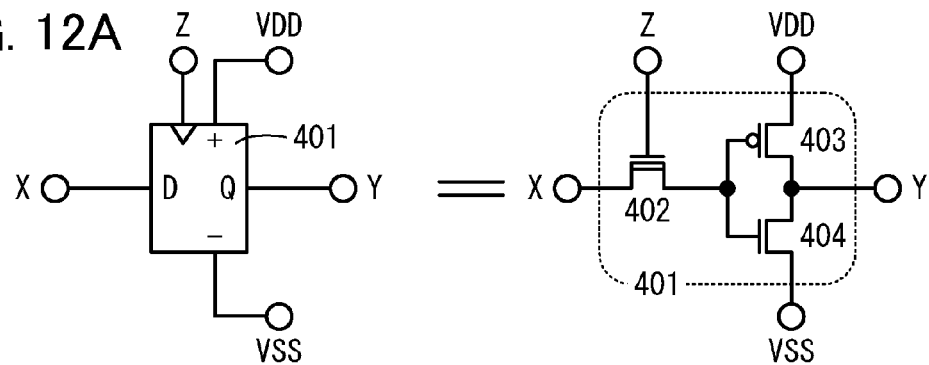
FIGS. 12A to 12C illustrate a signal processing circuit including a memory element.

In this embodiment, an example of a signal processing circuit will be described. FIG. 12A illustrates a symbol of a memory element 401 used in this embodiment and a circuit diagram of the memory element 401. The memory element 401 includes a writing transistor 402, a p-channel transistor 403, and an n-channel transistor 404. In other words, the memory element 401 used in this embodiment has substantially the same circuit as the memory element 231 described in Embodiment 3. As illustrated in FIG. 12A, the memory element 401 has an input terminal X, an output terminal Y, and a control terminal Z for controlling the memory element. In addition, the memory element 401 has connection terminals for a potential VDD and a potential VSS, which are omitted in some cases.

Figure 12B:
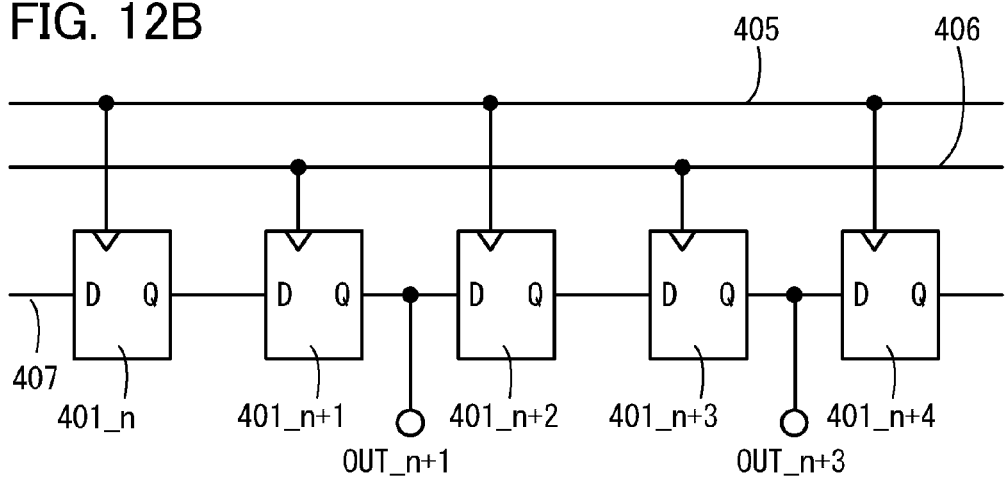

A serial-input, parallel-output shift register can be configured by connecting a plurality of such memory elements 401 in series, as illustrated in FIG. 12B. In FIG. 12B, n is an odd number, and output signals OUT are output from output terminals of memory elements in even-numbered stages. For example, an output signal OUT_n+1 is output from an output terminal of a memory element in the (n+1)-th stage, and an output signal OUT_n+3 is output from an output terminal of a memory element in the (n+3)-th stage.

Control terminals of memory elements in odd-numbered stages are connected to a clock signal line 405, and control terminals of the memory elements in the even-numbered stages are connected to a clock signal line 406. The clock signal line 405 and the clock signal line 406 may be supplied with a potential at which writing transistors in the even-numbered stages and writing transistors in the odd-numbered stages are not turned on at the same time.

For example, when the potential of the clock signal line 405 is a high-level potential, the potential of the clock signal line 406 may be set to a control potential, and when the potential of the clock signal line 405 is the control potential, the potential of the clock signal line 406 may be set to the high-level potential. Note that there may be a period in which the potential of the clock signal line 405 and the potential of the clock signal line 406 are set to the control potential at the same time. However, the potential of the clock signal line 405 and the potential of the clock signal line 406 should be prevented from being set to the high-level potential at the same time.

With the use of the circuit illustrated in FIG. 12B, a signal output from an output terminal 407 of a memory element in a previous stage is transmitted to subsequent stages in accordance with the signals of the clock signal line 405 and the clock signal line 406; the output signal OUT_n+1 and the output signal OUT_n+3 are sequentially output.

As the writing transistor 402 used in this embodiment, as described in Embodiment 3, an n-channel transistor whose off-state resistance is sufficiently high and whose threshold voltage is lower than a low-level potential may be used. As the p-channel transistor 403 and the n-channel transistor 404, a transistor whose threshold voltage is suitable for configuring an inverter may be selected.

Note that the signal processing circuit of FIG. 12B is configured such that signals are taken out from the output terminals of the memory elements in the even-numbered stages; for example, in the case where 256 parallel signals are taken out, 510 stages of memory elements (when an external signal is used for the first stage) are needed and a total of 510 inverters are needed.

Figure 12C:
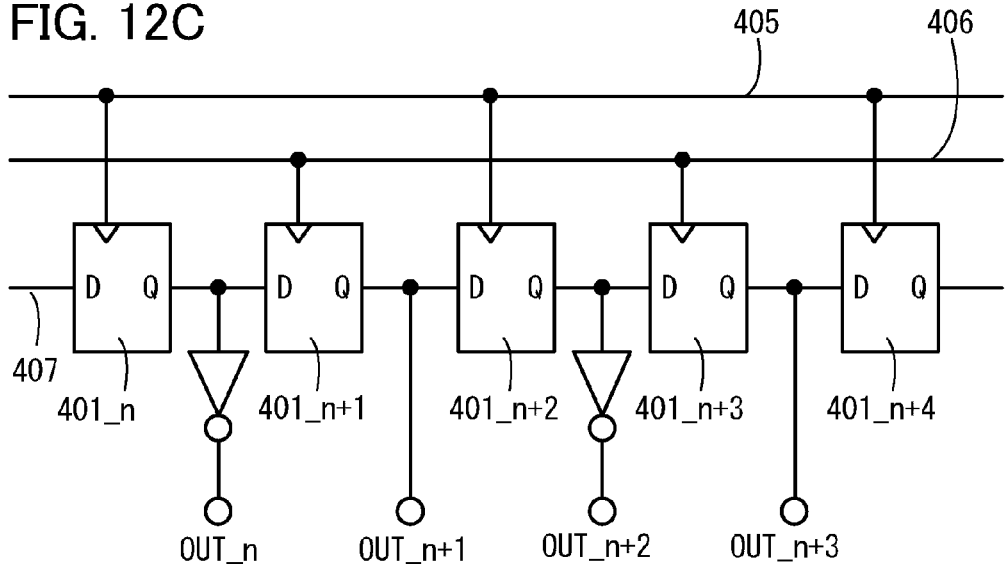

On the other hand, signals may be taken out from the output terminals of all the memory elements as in a signal processing circuit illustrated in FIG. 12C. In that case, a circuit for inverting output signals of memory elements may be provided in every other stage. For example, in the case where 256 parallel signals are taken out, 255 stages of memory elements are needed, and 128 circuits for inverting output signals are needed because the circuit is provided for every two memory elements.

In other words, a total of 383 inverters are needed, which are fewer than in the configuration where signals are taken out from the output terminals of the memory elements in the even-numbered stages as in FIG. 12B. Therefore, power consumption of the signal processing circuit due to leakage current of the inverters can be reduced, and in addition, the circuit area can be reduced.

A conventional serial-input, parallel-output signal processing circuit such as a shift register which is used in an image display device or the like is configured with a flip-flop circuit and has some problems. One of the problems is that the on-state resistances of the n-channel transistor and the p-channel transistor need to be substantially equal to each other for stable operation of the flip-flop circuit, which requires an increase in the channel width of the p-channel transistor and causes an increase in the circuit area per output. In addition, the increase in the channel width of the transistor also causes an increase in leakage current.

In contrast, in the signal processing circuit illustrated in FIG. 12B, although the number of inverters per output is the same as that in the shift register including a conventional flip-flop circuit, there is no need to maintain data with the flip-flop circuit and therefore the on-state resistance of the p-channel transistor may be three or more times the on-state resistance of the n-channel transistor. Thus, the circuit area can be small and the power consumption can be reduced. Note that in a circuit used in an image display device or the like, there is hardly any threshold voltage variation due to miniaturization; thus, the channel area may be 1 $F^2$.

Furthermore, in the signal processing circuit illustrated in FIG. 12C, the number of inverters themselves can also be reduced; thus, circuit area and power consumption can be further reduced. In addition, the memory element of this embodiment allows the capacitance necessary for data holding to be reduced, and in this regard, has a smaller area and operates at higher speed.

Figure 13:
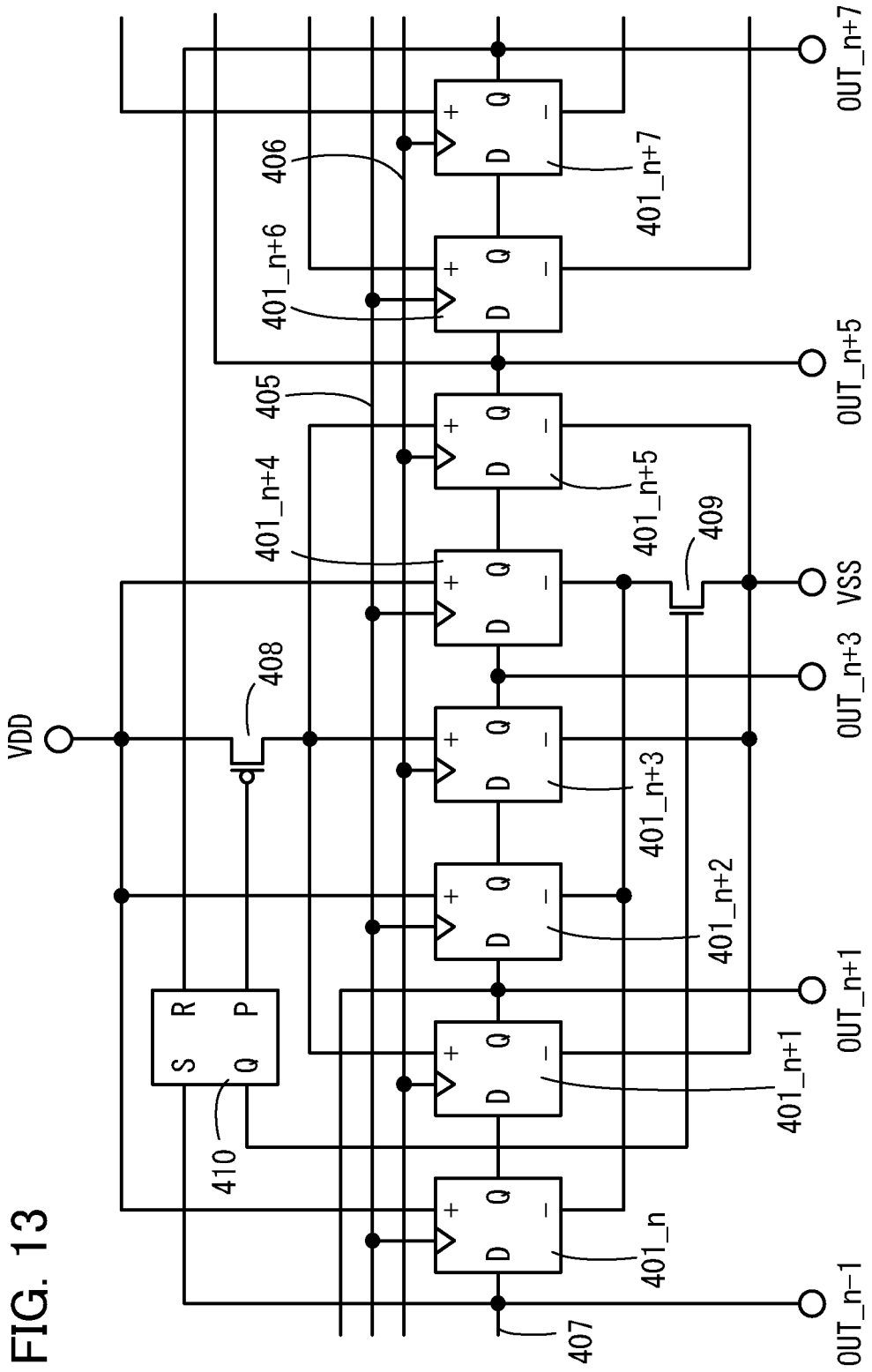
FIG. 13 illustrates a signal processing circuit including a memory element.

FIG. 13 illustrates an example of another signal processing circuit of this embodiment. FIG. 13 illustrates one unit of the signal processing circuit including 6 memory elements 401_n to 401_n+5. In this unit, the arrangement of memory elements and the connection thereof to a clock signal line 405 and a clock signal line 406 are the same as those illustrated in FIG. 12B. Besides that, the memory elements in the odd-numbered stages are connected to a potential VSS through an n-channel transistor 409, and the memory elements in the even-numbered stages are connected to a potential VDD through a p-channel transistor 408.

A signal input to the memory element 401_n (n is an odd number) and a signal output from the memory element 401_n+7 in the next unit are input to a set terminal (S) and a reset terminal (R), respectively, of a flip-flop circuit 410 which is an RS flip-flop circuit, and the flip-flop circuit 410 outputs signals from terminals Q and P. Note that the flip-flop circuit 410 is not limited to an RS flip-flop circuit and may have another structure.

Note that the signal output from the terminal P is an inverted output of the signal output from the terminal Q. The signal output from the terminal Q and the signal output from the terminal P are applied to a gate of the n-channel transistor 409 and a gate of the p-channel transistor 408, respectively. In addition, the output from the memory element 401_n+1 is input to a reset terminal of a flip-flop circuit of the previous unit, and the output from the memory element 401_n+5 is input to a set terminal of a flip-flop circuit of the next unit.

A method for operating such a unit of the signal processing circuit will be briefly described. It is assumed that at first, the output terminal 407 of a memory element (or unit) of a previous stage is at a low-level potential and the output signal OUT_n+1, the output signal OUT_n+3, the output signal OUT_n+5, and the output signal OUT_n+7 are all at the low-level potential. Therefore, the low-level potential is input to the terminal S and the terminal R of the flip-flop circuit 410, and the low-level potential and the high-level potential are output from the terminal Q and the terminal P, respectively.

After that, when the potential of the output terminal 407 of the memory element in the previous stage becomes the high-level potential (signal potential), the high-level potential and the low-level potential are output from the terminal Q and the terminal P, respectively, of the flip-flop circuit 410. Then, as illustrated in FIG. 12B, the signal potential is transmitted through the memory elements and the low-level potential is input to the terminal S of the flip-flop circuit 410, but the high-level potential and the low-level potential are still output from the terminal Q and the terminal P, respectively.

After that, when the signal potential is output from the memory element 401_$n$+7, the high-level potential is input to the terminal R of the flip-flop circuit 410; as a result, the low-level potential and the high-level potential are output from the terminal Q and the terminal P, respectively. Then, the signal potential is transmitted to the next memory element (or the next unit) and the low-level potential is input to the terminal R of the flip-flop circuit 410, but the state is maintained in which the low-level potential and the high-level potential are output from the terminal Q and the terminal P, respectively.

That is, in the case where the signal potential is present between the input terminal of the memory element 401_$n$ and the output terminal of the memory element 401_$n$+7, the p-channel transistor 408 and the n-channel transistor 409 are both on, and in other cases, the both are off.

In the unit of the signal processing circuit illustrated in FIG. 13, the low-level potential is input to the memory element 401_$n$ on the far left in most periods and the high-level potential (signal potential) is input occasionally. Therefore, the low-level potential is input to the memory elements in the odd-numbered stages in most periods and the high-level potential is input occasionally, and the high-level potential is input to the memory elements in the even-numbered stages in most periods and the low-level potential is input occasionally.

Accordingly, in each of the memory elements in the odd-numbered stages, in most cases, the n-channel transistor 404 (see FIG. 12A) of the inverter is off and the p-channel transistor 403 is on, and the leakage current of the memory elements in the odd-numbered stages is substantially determined by the off-state resistance of the n-channel transistors 404 in the stages which are connected in parallel.

However, since the n-channel transistor 409 is connected in series to the n-channel transistors 404, the leakage current of the signal processing circuit is also determined by the off-state resistance of the n-channel transistor 409 (when its gate is kept at the low-level potential). For example, when the channel width of the n-channel transistor 409 is three times that of the n-channel transistor 404, the synthesized off-state resistance of the memory elements in the odd-numbered stages is twofold when considered simply, fivefold or more when other effects are taken into consideration, and tenfold or more in some cases.

On the other hand, when the n-channel transistor 409 is on, the on-state resistance of the memory elements in the odd-numbered stages (here, the high-level potential is input to only one of the memory elements in the odd-numbered stages) is 1.33 times that in the case where the n-channel transistor 409 is not provided.

From a similar discussion, the off-state resistance of the memory elements in the even-numbered stages is twofold when considered simply, fivefold or more when other effects are taken into consideration, and tenfold or more in some cases. The on-state resistance of the memory elements in the even-numbered stages is 1.33 times that in the case where the p-channel transistor 408 is not provided.

The above discussions are about one unit including 6 stages of memory elements in the signal processing circuit; such structures are provided in the whole signal processing circuit. For example, in a shift register with 240 stages, there are 40 such units as illustrated in FIG. 13. The signal potential is present in only one of the 32 units, and in the other 38 or 39 units, the p-channel transistors 408 and the n-channel transistors 409 are off; thus, leakage current can be reduced.

On the other hand, in the unit where the signal potential is present, the p-channel transistor 408 and the n-channel transistor 409 are on, and a necessary on-state resistance can be achieved in the connection between the p-channel transistor 403 and the p-channel transistor 408 and/or between the n-channel transistor 404 and the n-channel transistor 409.

A reduction of on-state resistance becomes significantly effective in some cases if the number of memory elements included in a unit is increased. For example, the case where one unit includes 24 memory elements will be considered. Each of the channel widths of the p-channel transistor 408 and the n-channel transistor 409 is assumed to be 6 times that of the p-channel transistor 403 and the n-channel transistor 404.

In that case, when the signal potential is not present in the unit, the off-state resistance is fivefold when considered simply and is practically higher than that. On the other hand, when the signal potential is present in the unit, the on-state resistance of the p-channel transistors 403 and the n-channel transistors 404 of the memory elements is 1.17-fold. This is because each of the channel widths of the p-channel transistor 408 and the n-channel transistor 409 is twice that in the above example of three times that of the p-channel transistors 403 and the n-channel transistors 404.

With the p-channel transistor 408 and the n-channel transistor 409 provided in this manner, the leakage current of the signal processing circuit can be drastically reduced. Although the on-state resistance increases, it can be within such a range that does not interfere with signal processing.

In general, when the number of shift registers included in one unit is N ($\geq$2), each of the channel widths of the p-channel transistor 408 and the n-channel transistor 409 may be 1 to N times, preferably 1 to N/2 times, that of the p-channel transistors 403 and the n-channel transistors 404.

Note that an object to be controlled by the p-channel transistor 408 and the n-channel transistor 409 is not limited to an inverter of a shift register and may be an inverter of a circuit which is included in a unit and operates in synchronization with the output of a shift register. Examples include an inverter of a buffer circuit which operates in response to an output signal of a shift register, and the like. Some such inverters have a significantly large channel width so as to allow more current to flow. Therefore, a transistor which has a larger channel width and synchronizes with the p-channel transistor 408 and the n-channel transistor 409 may be additionally provided.

In the above example, the signal processing circuit is designed such that when a data signal is input to a memory element in the first stage of a unit (the memory element 401_$n$ in FIG. 13), the p-channel transistor 408 and the n-channel transistor 409 are turned on, and when a data signal is output from a memory element in the last stage of the unit (the memory element 401_$n$+7 in FIG. 13), the p-channel transistor 408 and the n-channel transistor 409 are turned off. The timing may be changed.

For example, the signal processing circuit may be designed such that when a data signal is input to a memory element preceding the memory element 401_$n$, the p-channel transistor 408 and the n-channel transistor 409 are turned on, or such that when a data signal is output from a memory element following the memory element 401_*n*+7, the p-channel transistor 408 and the n-channel transistor 409 are turned off.

The signal processing circuits shown in FIGS. 12A to 12C and FIG. 13 can be operated without the special conditions for the writing transistor 402. However, more preferable advantages can be obtained by using the transistor having the threshold voltage satisfying the above described conditions.

Embodiment 6

In this embodiment, an example of a layout of an n-channel transistor and a p-channel transistor which are included in an inverter used for a memory element will be described with reference to FIGS. 14A to 14C. Note that the only difference of the memory element described in this embodiment from the memory element described in Embodiment 4 is a planar layout; therefore, FIG. 9 may be referred to for a cross-sectional shape.

Figure 14A:
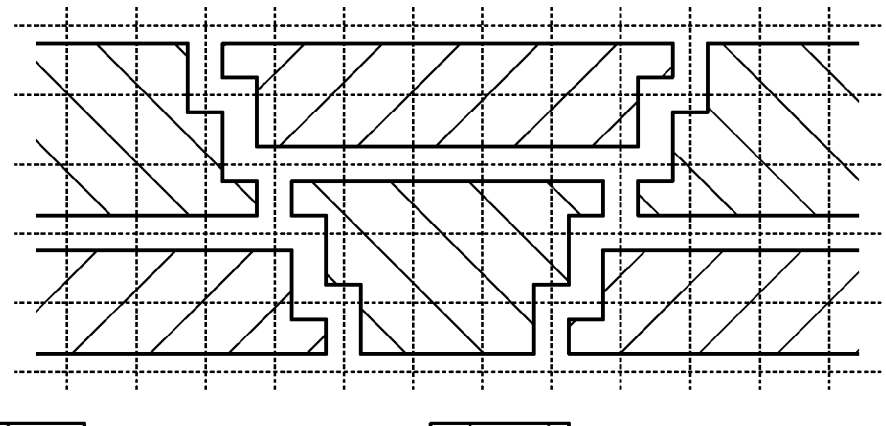
FIGS. 14A to 14C are top views illustrating a structure of a memory element.

FIG. 14A illustrates the shapes of a p-type well 303 used for an n-channel transistor and an n-type well 302 used for a p-channel transistor which are included in an inverter. The n-type well 302 and the p-type well 303 are rectangular in FIG. 10A, but are polygonal in this embodiment. This enables the degree of integration to be increased. The area necessary for each memory element of this embodiment is 55 $F^2$.

Figure 14B:
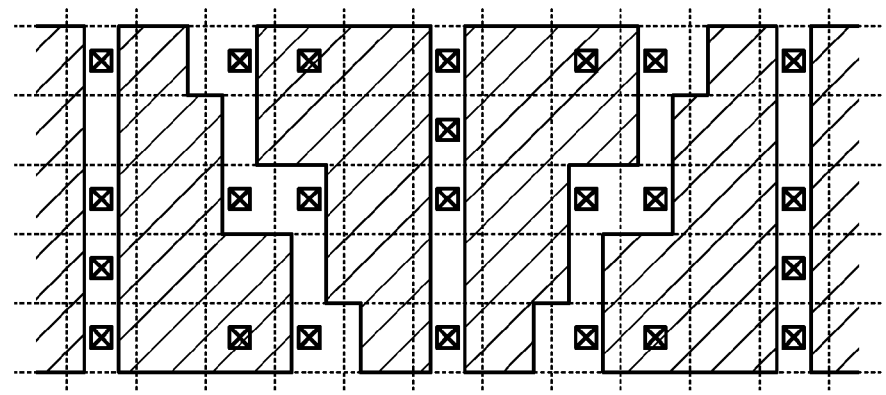
Figure 14C:
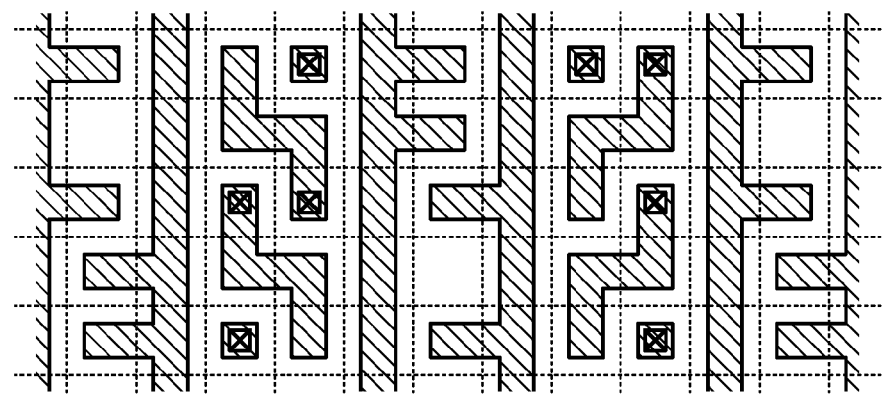
Figure 15A:
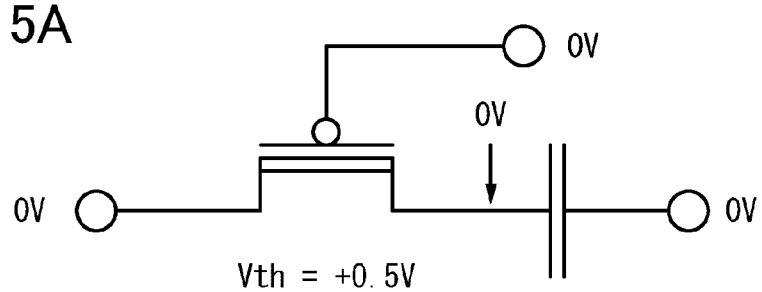
FIGS. 15A to 15D illustrate operation of a memory element.
Figure 15B:
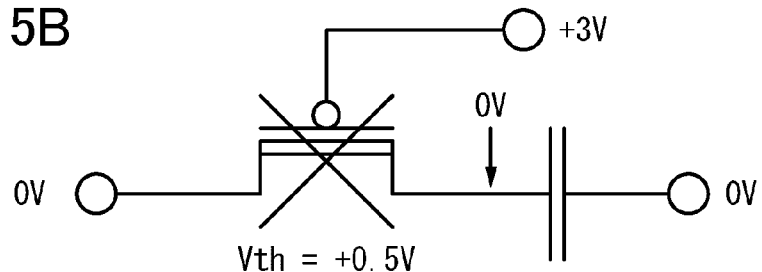
Figure 15C:
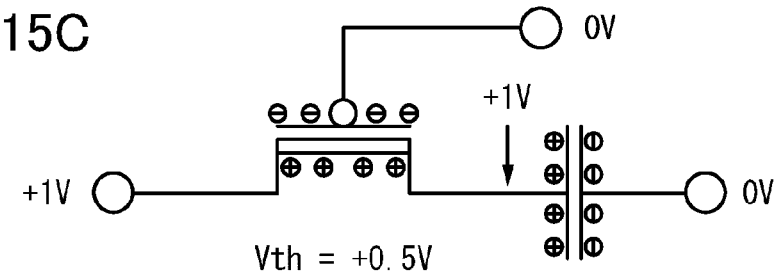
Figure 15D:
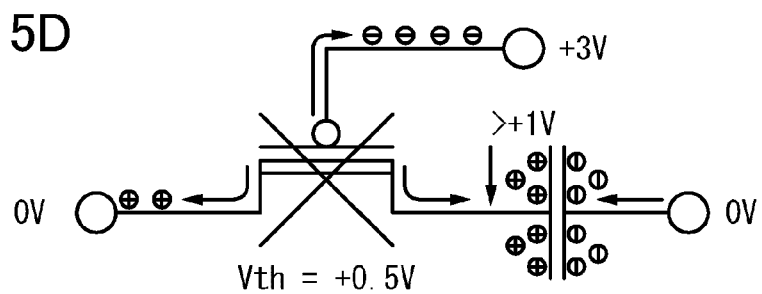

FIG. 14B illustrates the layout of a first wiring 307 and a first contact plug 309, and FIG. 14C illustrates the layout of a second wiring 310 and a second contact plug 313.

It can be seen from FIGS. 14A to 14C that the n-channel transistor has a channel area of 15 $F^2$ and the p-channel transistor has a channel area of 13 $F^2$. In addition, the n-channel transistor has an effective channel ratio (="effective channel length"/"effective channel width") of 5/3 and the p-channel transistor has an effective channel ratio of 1/2.

Therefore, the ratio of the effective channel ratio of the n-channel transistor to the effective channel ratio of the p-channel transistor (="effective channel ratio of the n-channel transistor"/"effective channel ratio of the p-channel transistor") is approximately 3.3, and the difference in mobility between the n-channel transistor and the p-channel transistor is fully taken into consideration for the structure.

The signal processing circuits shown in FIGS. 14A to 14C can be operated without the special conditions for the writing transistors. However, more preferable advantages can be obtained by using the transistors having the threshold voltage satisfying the above described conditions.

Embodiment 7

In this embodiment, a case is described in which a p-channel transistor is used as the writing transistor 101 of the memory element 100 in FIG. 3A. One example of wide bandgap oxide semiconductors is a material exhibiting a hole conducting property (such as a Zn—Rh-based oxide, a Sr—Cu-based oxide, or an Al—Cu-based oxide), which may be used to manufacture the p-channel transistor. Alternatively, a significantly thin film of a known semiconductor material such as silicon can be used as the semiconductor layer (channel formation region) (see Reference 5).

In any case, the threshold voltage needs to be higher than the low-level potential. In order to achieve that, when a known semiconductor material such as silicon is used, for example, the semiconductor layer may be doped so as to have p-type conductivity. Furthermore, as a gate material, a metal or a semiconductor which has high work function may be used. For example, indium nitride has a work function of 5.6 eV. An oxynitride containing indium, gallium, and zinc (an In—Ga—Zn-based oxynitride) also has a work function of 5.6 eV.

A sufficiently long-channel, p-channel transistor including a 2 nm thick semiconductor layer of intrinsic silicon, a gate insulator with an EOT of 10 nm, and a gate of a material having a work function of 5.6 eV has a threshold voltage of about +0.5 V. In general, a preferable range of threshold voltage is $V_L+0.3<V_{th}<V_H-V_L$, where $V_H$ is a high-level potential and $V_L$ is a low-level potential (both in volts).

Such a material having a high work function can form an ohmic contact when used in a portion in contact with the semiconductor layer. For example, a semiconductor layer of silicon has an ionization potential of about 5.1 eV; therefore, when the semiconductor layer is in contact with a material having a work function of 5.6 eV, holes are injected into the semiconductor layer and a favorable contact is formed. Furthermore, a structure where such a material having a high work function is in contact with the semiconductor layer is preferable in order to make the threshold voltage of the transistor higher than the low-level potential.

Note that in the case where polycrystalline silicon is used for the semiconductor layer, a large channel length is preferable in order to reduce threshold voltage variation among transistors due to grain boundaries, and the semiconductor layer preferably has a meandering shape as described in Embodiment 4 for obtaining a long and narrow channel.

In growth of polycrystalline silicon, a catalytic element such as nickel may be added to lower the growth temperature. Polycrystalline silicon grown with a catalytic element added has a low potential barrier at grain boundaries; thus, transistors formed using the polycrystalline silicon show little threshold voltage variation. Therefore, the channel length can be sufficiently short.

Furthermore, polycrystalline silicon has sufficiently high mobility and is therefore advantageous in terms of operation speed. For this reason, a capacitor may have a larger capacitance. Since the off-state resistance of a thin film of polycrystalline silicon is inferior to that of an oxide semiconductor, the length of time data can be held is preferably increased by increasing the capacitance of the capacitor.

The operation of such a memory element including a p-channel transistor will be described with reference to FIGS. 15A to 15D. In a circuit illustrated in FIGS. 15A to 15D, a source of the transistor is connected to a first electrode of a capacitor, and the potential of a second electrode of the capacitor is fixed to 0 V. In addition, a high-level potential is +1 V, a low-level potential is 0 V, and a control potential is +3 V.

First, the potential of the first electrode of the capacitor is set to the low-level potential. In order to achieve that, the potential of a gate of the transistor is set to the low-level potential, and the potential of a drain thereof is set to the low-level potential. Since the threshold voltage of the transistor is +0.5 V, the transistor is on, and the potential of the source of the transistor (i.e., the potential of the first electrode of the capacitor) is the low-level potential.

In that case, a capacitance (gate capacitance) is formed between the gate and a channel of the transistor. However, there is no potential difference therebetween and therefore no charges appear. In addition, there is no potential difference between the first electrode and the second electrode of the capacitor and therefore no charges appear at the first electrode of the capacitor (see FIG. 15A).

After that, the transistor is turned off. In order to achieve that, the potential of the gate of the transistor is set to the control potential. As described above, there are no charges in a gate capacitor; therefore, the amount of charge at the first electrode of the capacitor does not change and the potential of the first electrode of the capacitor remains the low-level potential (see FIG. 15B).

Next, the potential of the first electrode of the capacitor is set to the high-level potential. In order to achieve that, the potential of the gate of the transistor is set to the low-level potential, and the potential of the drain thereof is set to the high-level potential. Since the threshold voltage of the transistor is +0.5 V, the transistor is turned on, and the potential of the source of the transistor becomes the high-level potential.

In that case, a capacitance (gate capacitance) is formed between the gate and the channel of the transistor and the potential of the channel is higher than the potential of the gate; thus, positive charges and negative charges appear at the channel and the gate, respectively. In addition, there is a potential difference between the first electrode and the second electrode of the capacitor; thus, positive charges appear at the first electrode of the capacitor (see FIG. 15C).

After that, the potential of the gate of the transistor is set to the control potential to turn off the transistor. As described above, there are positive charges in the channel, some of which flow into the first electrode of the capacitor; thus, the potential of the first electrode of the capacitor becomes higher than the high-level potential (see FIG. 15D). However, since a potential higher than the high-level potential is recognized as the high-level potential, malfunction does not occur.

Figure 2A:
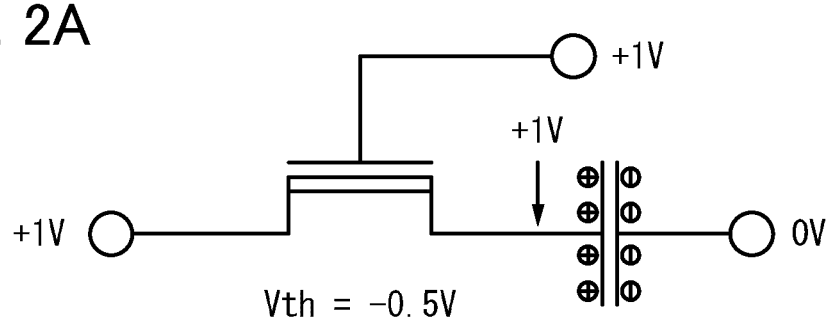
FIGS. 2A to 2C illustrate operation of a memory element.
Figure 2B:
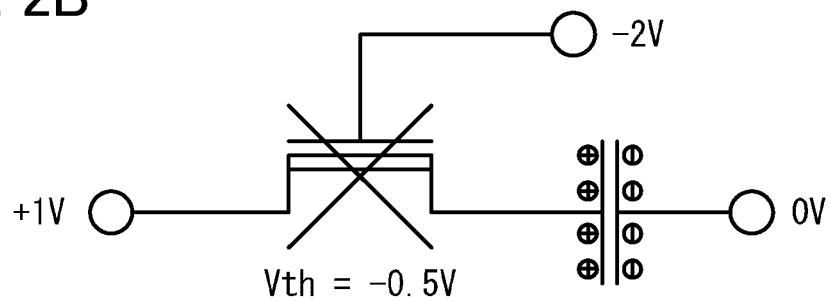
Figure 2C:
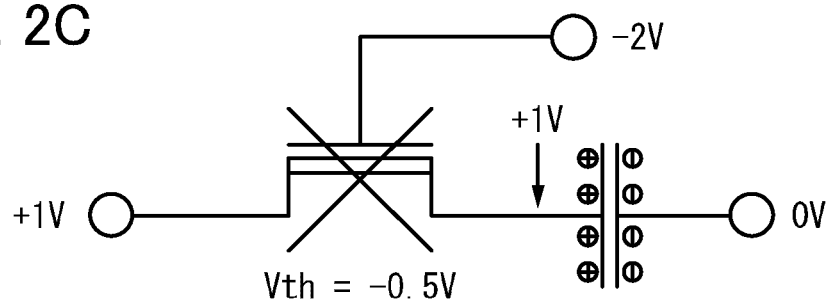

Note that the absolute value of the effective gate voltage ("gate potential"—"source potential"—"threshold voltage") is 1.5 V when the transistor is on in the driving method illustrated in FIGS. 2A to 2C, whereas it is 0.5 V in this embodiment, and this causes the on-state current to be smaller. By increasing the threshold voltage, the on-state current can be increased.

This application is based on Japanese Patent Application serial no. 2011-266515 filed with Japan Patent Office on Dec. 6, 2011, the entire contents of which are hereby incorporated by reference.

What is claimed is:

1. A method for driving a signal processing circuit comprising:
    a first transistor;
    a capacitor;
    a second transistor;
    a third transistor; and
    a fourth transistor,
    wherein a low-level potential and a high-level potential higher than the low-level potential are input to one of a source and a drain of the first transistor,
    wherein the other of the source and the drain of the first transistor is connected to one electrode of the capacitor and a gate of the second transistor,
    wherein a drain of the second transistor is connected to one of a source and a drain of the third transistor,
    wherein the other of the source and the drain of the third transistor is connected to a gate of the fourth transistor, and
    wherein a capacitance connected to the other of the source and the drain of the first transistor is twice a gate capacitance of the first transistor or smaller,
    the method comprising:
    turning on the first transistor when the third transistor is off;
    turning off the first transistor when the third transistor is off; and
    turning on the third transistor when the first transistor is off,
    wherein the first transistor is always off when the third transistor is on,
    wherein the third transistor is always off when the first transistor is on, and
    wherein a highest potential applied to a gate of the first transistor is the high-level potential and a lowest potential applied to the gate of the first transistor is lower than the low-level potential.

2. The method for driving the signal processing circuit according to claim 1, wherein the first transistor comprises an oxide semiconductor in a channel formation region.

3. The method for driving the signal processing circuit according to claim 1, wherein a channel length of the first transistor is 10 or more times a minimum feature size.

4. The method for driving the signal processing circuit according to claim 1, wherein the first transistor comprises a thin film semiconductor.

5. The method for driving the signal processing circuit according to claim 1,
    wherein a threshold voltage of the first transistor is lower than the low-level potential,
    wherein a threshold voltage of the third transistor is lower than the low-level potential.

6. The method for driving the signal processing circuit according to claim 5,
    wherein the threshold voltage (in volts) of the first transistor is higher than $V_L-V_H$ and lower than $V_L-0.3$, where $V_L$ (in volts) is the low-level potential and $V_H$ (in volts) is the high-level potential.

7. A method for driving a signal processing circuit comprising:
    a first transistor;
    a second transistor;
    a third transistor; and
    a fourth transistor,
    wherein a low-level potential and a high-level potential higher than the low-level potential are input to one of a source and a drain of the first transistor,
    wherein the other of the source and the drain of the first transistor is connected to a gate of the second transistor,
    wherein one of a source and a drain of the second transistor is connected to one of a source and a drain of the third transistor,
    wherein the other of the source and the drain of the third transistor is connected to a gate of the fourth transistor, and
    wherein a capacitance connected to the other of the source and the drain of the first transistor is twice a gate capacitance of the first transistor or smaller,
    the method comprising:
    turning on the first transistor when the third transistor is off;
    turning off the first transistor when the third transistor is off; and
    turning on the third transistor when the first transistor is off,
    wherein the first transistor is always off when the third transistor is on,
    wherein the third transistor is always off when the first transistor is on, and
    wherein a highest potential applied to a gate of the first transistor is the high-level potential and a lowest potential applied to the gate of the first transistor is lower than the low-level potential.

8. The method for driving the signal processing circuit according to claim 7, wherein the second transistor is included in a CMOS inverter.

9. The method for driving the signal processing circuit according to claim 7, wherein the first transistor comprises an oxide semiconductor in a channel formation region.

10. The method for driving the signal processing circuit according to claim 7, wherein a channel length of the first transistor is 10 or more times a minimum feature size.

11. The method for driving the signal processing circuit according to claim 7, wherein the first transistor comprises a thin film semiconductor.

12. The method for driving the signal processing circuit according to claim 7,
wherein a threshold voltage of the first transistor is lower than the low-level potential,
wherein a threshold voltage of the third transistor is lower than the low-level potential.

13. The method for driving the signal processing circuit according to claim 12,
wherein the threshold voltage (in volts) of the first transistor is higher than $V_L-V_H$ and lower than $V_L-0.3$, where $V_L$ (in volts) is the low-level potential and $V_H$ (in volts) is the high-level potential.

14. A method for driving a signal processing circuit comprising:
a first transistor;
a second transistor, the second transistor being an n-channel transistor;
a third transistor, the third transistor being a p-channel transistor;
a fourth transistor;
a fifth transistor; and
a sixth transistor,
wherein a low-level potential and a high-level potential higher than the low-level potential are input to one of a source and a drain of the first transistor,
wherein the other of the source and the drain of the first transistor is connected to a gate of the second transistor and a gate of the third transistor,
wherein a drain of the second transistor is connected to a drain of the third transistor and one of a source and a drain of the fourth transistor,
wherein the other of the source and the drain of the fourth transistor is connected to a gate of the fifth transistor and a gate of the sixth transistor,
wherein a drain of the fifth transistor is connected to a drain of the sixth transistor, and
wherein a capacitance connected to the other of the source and the drain of the first transistor is twice a gate capacitance of the first transistor or smaller,
the method comprising:
turning on the first transistor when the fourth transistor is off;
turning off the first transistor when the fourth transistor is off; and
turning on the fourth transistor when the first transistor is off,
wherein the first transistor is always off when the fourth transistor is on,
wherein the fourth transistor is always off when the first transistor is on, and
wherein a highest potential applied to a gate of the first transistor is the high-level potential and a lowest potential applied to the gate of the first transistor is lower than the low-level potential.

15. The method for driving the signal processing circuit according to claim 14, wherein the first transistor comprises an oxide semiconductor in a channel formation region.

16. The method for driving the signal processing circuit according to claim 14, wherein a channel length of the first transistor is 10 or more times a minimum feature size.

17. The method for driving the signal processing circuit according to claim 14, wherein a channel area of the second transistor is 80% or more and 125% or less of the third transistor.

18. The method for driving the signal processing circuit according to claim 14,
wherein a threshold voltage of the first transistor is lower than the low-level potential,
wherein a threshold voltage of the fourth transistor is lower than the low-level potential.

19. The method for driving the signal processing circuit according to claim 18,
wherein the threshold voltage (in volts) of the first transistor is higher than $V_L-V_H$ and lower than $V_L-0.3$, where $V_L$ (in volts) is the low-level potential and $V_H$ (in volts) is the high-level potential.

* * * * *